(12) United States Patent
Ito et al.

(10) Patent No.: US 11,063,035 B2
(45) Date of Patent: Jul. 13, 2021

(54) SEMICONDUCTOR INTEGRATED CIRCUIT DEVICE

(71) Applicant: SOCIONEXT INC., Kanagawa (JP)

(72) Inventors: Chika Ito, Yokohama (JP); Isaya Sobue, Yokohama (JP); Hidetoshi Tanaka, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/803,748

(22) Filed: Feb. 27, 2020

(65) Prior Publication Data

US 2020/0203334 A1 Jun. 25, 2020

Related U.S. Application Data

(63) Continuation of application No. PCT/JP2017/031449, filed on Aug. 31, 2017.

(51) Int. Cl.
*H01L 27/02* (2006.01)
*H01L 21/8238* (2006.01)
*H01L 27/092* (2006.01)
*H01L 29/06* (2006.01)

(52) U.S. Cl.
CPC .. *H01L 27/0266* (2013.01); *H01L 21/823871* (2013.01); *H01L 27/0255* (2013.01); *H01L 27/092* (2013.01); *H01L 29/0673* (2013.01)

(58) Field of Classification Search
CPC ......... H01L 21/823871; H01L 27/0266; H01L 27/0255; H01L 27/092; H01L 29/0673
USPC ....................................................... 257/401
See application file for complete search history.

(56) References Cited

U.S. PATENT DOCUMENTS

| 2011/0057163 A1 | 3/2011 | Liu et al. |
| 2015/0021595 A1* | 1/2015 | In .......................... H01L 27/1225 257/43 |
| 2015/0255449 A1* | 9/2015 | Kim ...................... G09G 3/3648 349/40 |

(Continued)

FOREIGN PATENT DOCUMENTS

| JP | 2017-11069 A | 1/2017 |
| WO | 2009/150999 A1 | 12/2009 |

(Continued)

OTHER PUBLICATIONS

International Search Report issued in corresponding International Search Report issued in PCT/JP2017/031449, dated Nov. 28, 2017, with partial translation.

*Primary Examiner* — Igwe U Anya
(74) *Attorney, Agent, or Firm* — McDermott Will & Emery LLP

(57) ABSTRACT

An ESD protection circuit includes a first fin structure having fins of a first conductivity type and a second fin structure having fins of a second conductivity type, the second fin structure being opposed to the first fin structure. A first power interconnect connected with the first fin structure and a signal interconnect connected with the second fin structure are formed in a first interconnect layer, and a second power interconnect connected with the first power interconnect is formed in a second interconnect layer. The width occupied by the second fin structure is greater than that of the first fin structure, and the width of the signal interconnect is greater than that of the first power interconnect.

14 Claims, 16 Drawing Sheets

(56) References Cited

U.S. PATENT DOCUMENTS

| | | | |
|---|---|---|---|
| 2015/0348961 A1* | 12/2015 | Isobe | ............... H01L 23/60 |
| | | | 361/56 |
| 2016/0172351 A1 | 6/2016 | Shimbo | |
| 2016/0190138 A1* | 6/2016 | Shimbo | ........... H01L 29/6681 |
| | | | 257/369 |
| 2016/0372453 A1 | 12/2016 | Suzuki | |
| 2018/0233498 A1* | 8/2018 | Xu | ................ H01L 27/124 |
| 2018/0366589 A1 | 12/2018 | Shimbo | |

FOREIGN PATENT DOCUMENTS

| | | |
|---|---|---|
| WO | 2015/029280 A1 | 3/2015 |
| WO | 2015/033490 A1 | 3/2015 |
| WO | 2017/145906 A1 | 8/2017 |

* cited by examiner

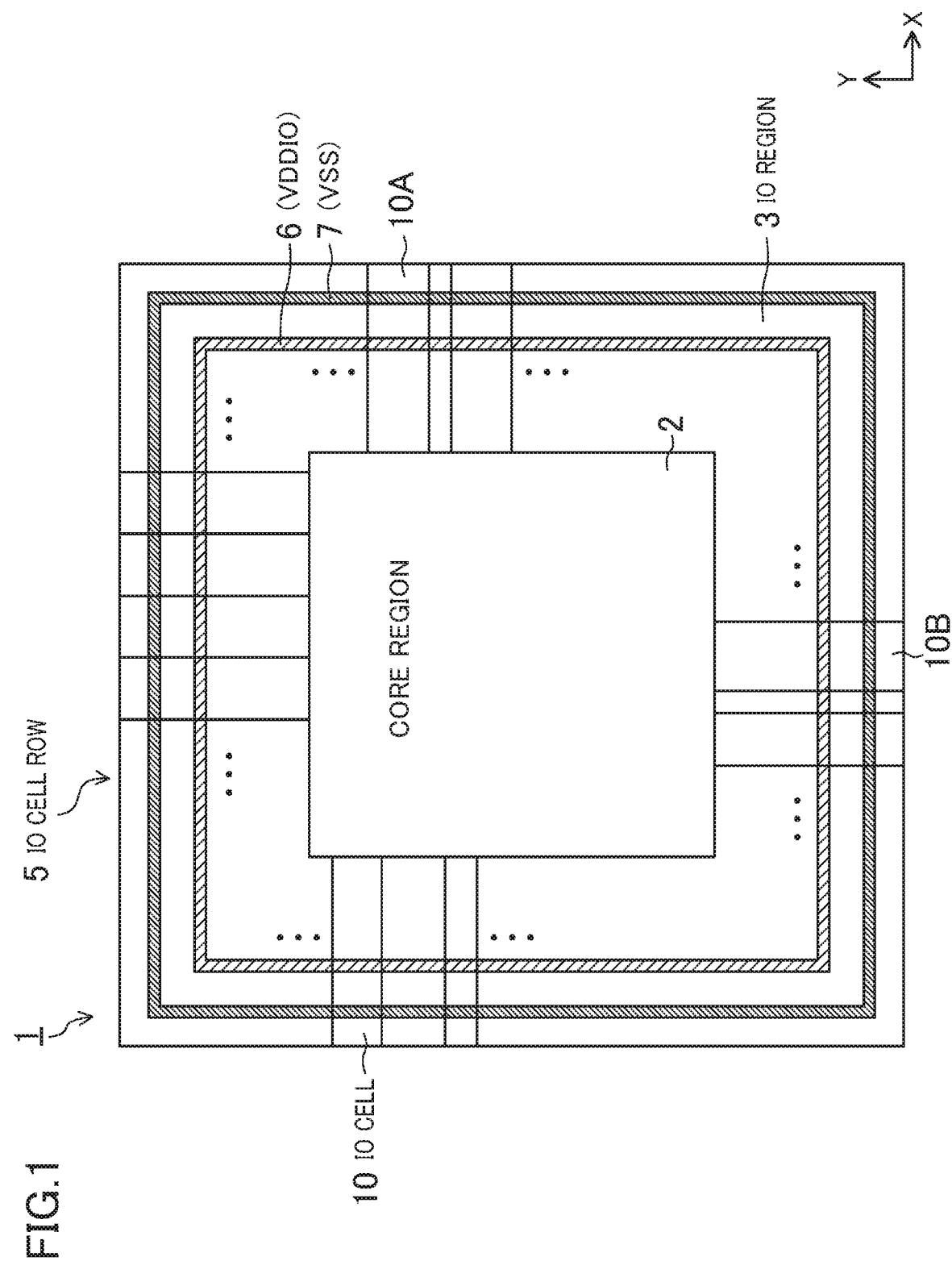

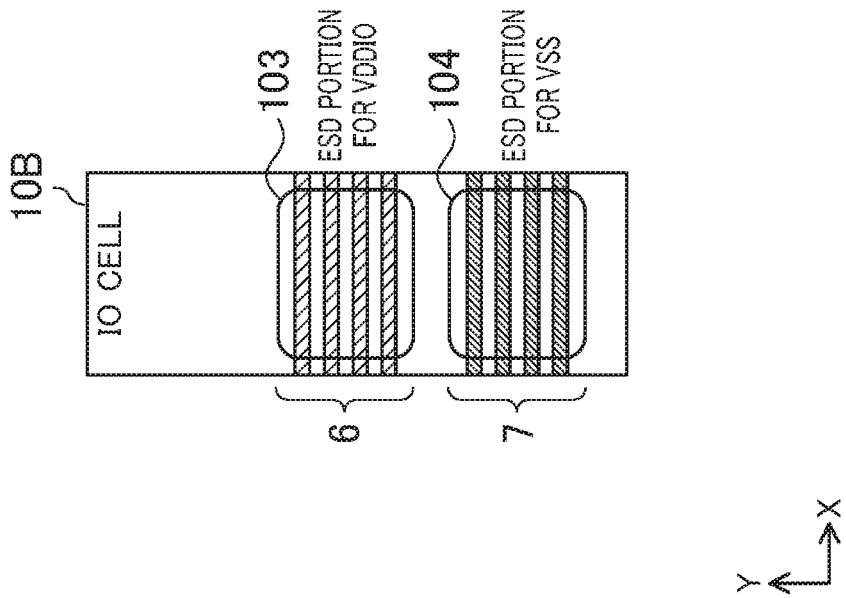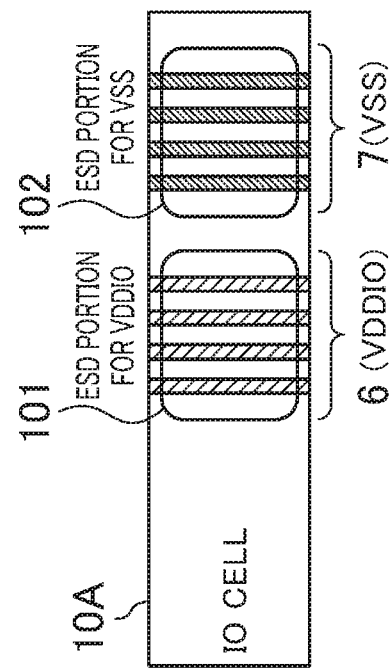

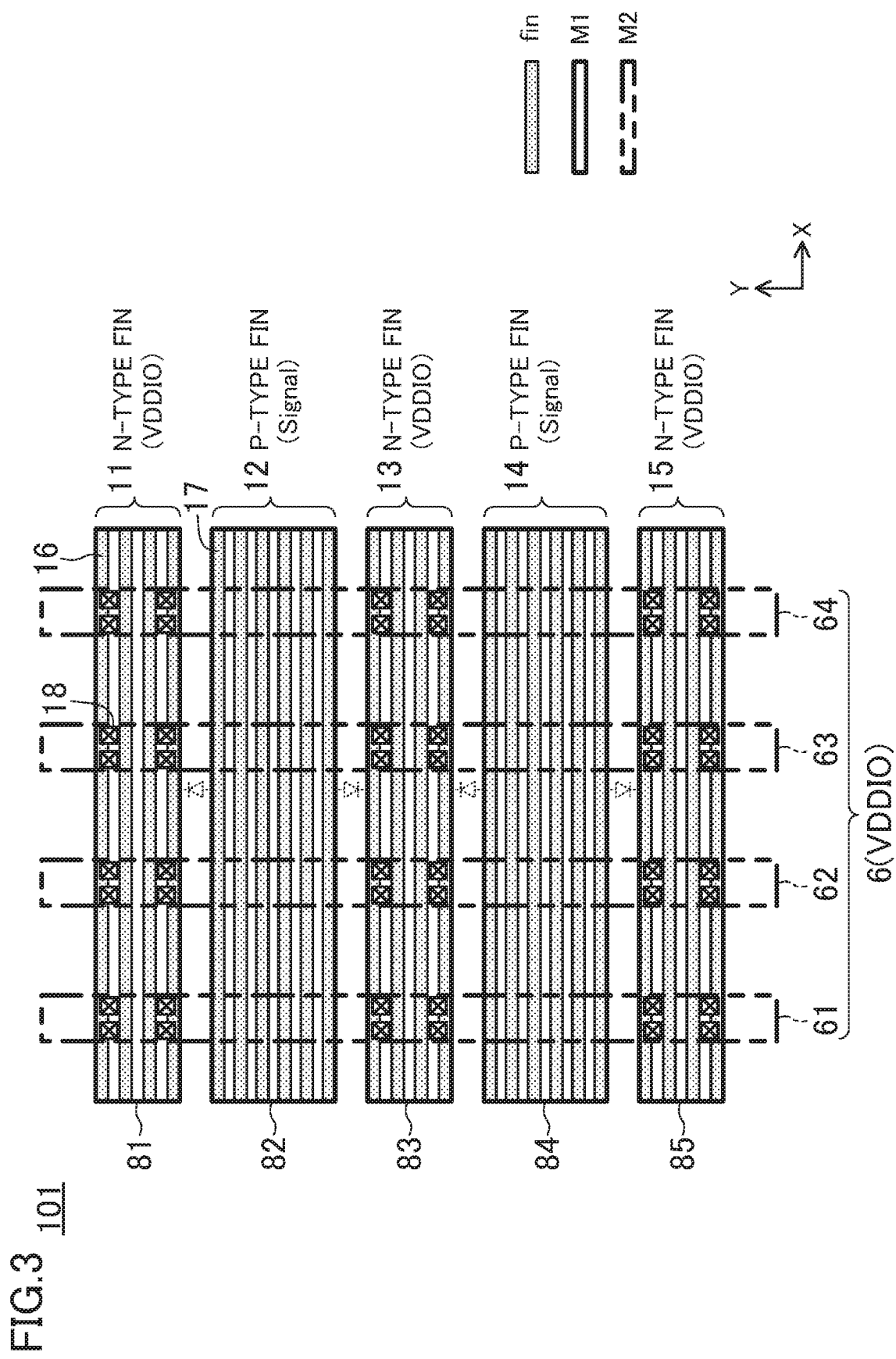

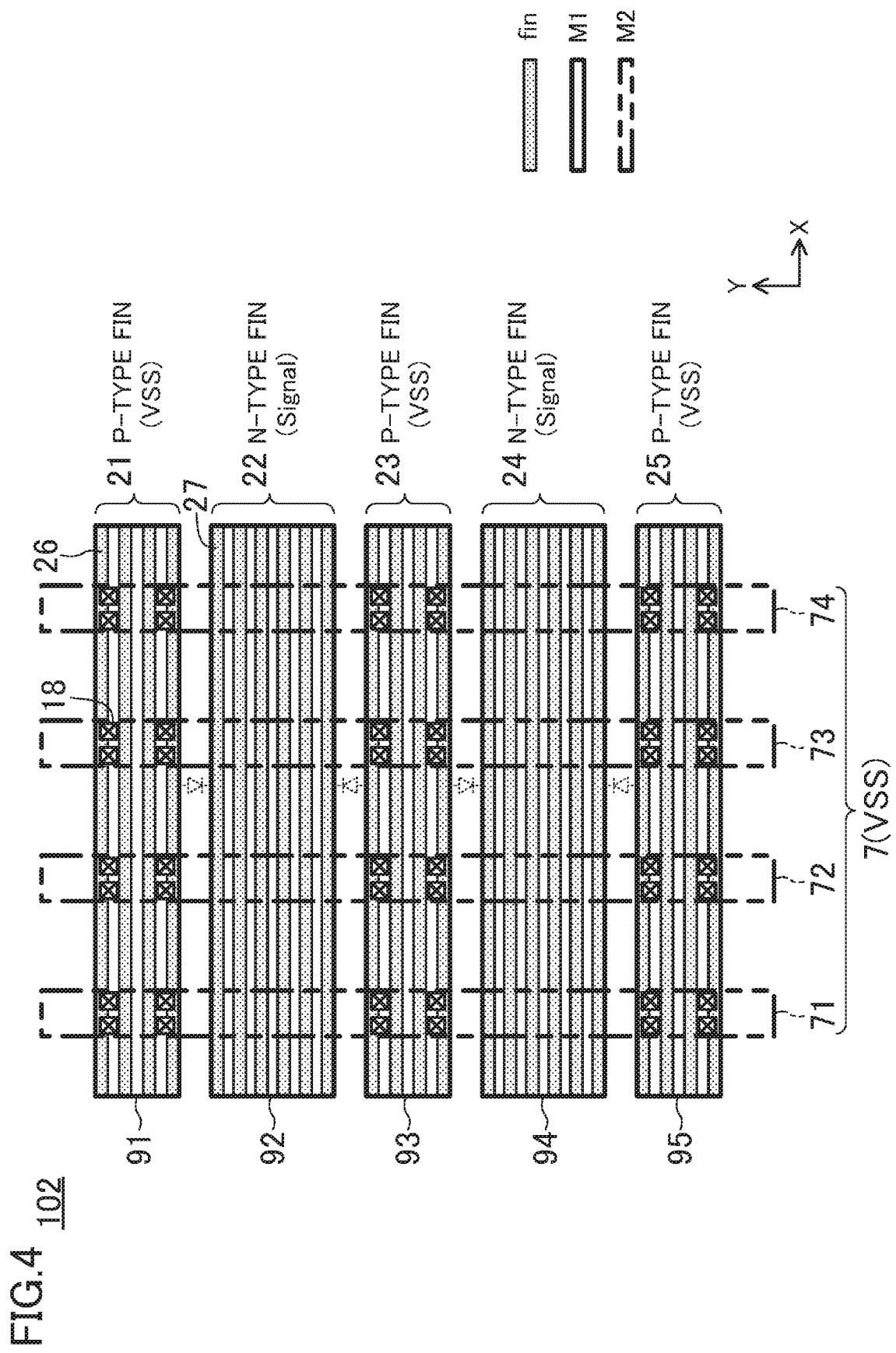

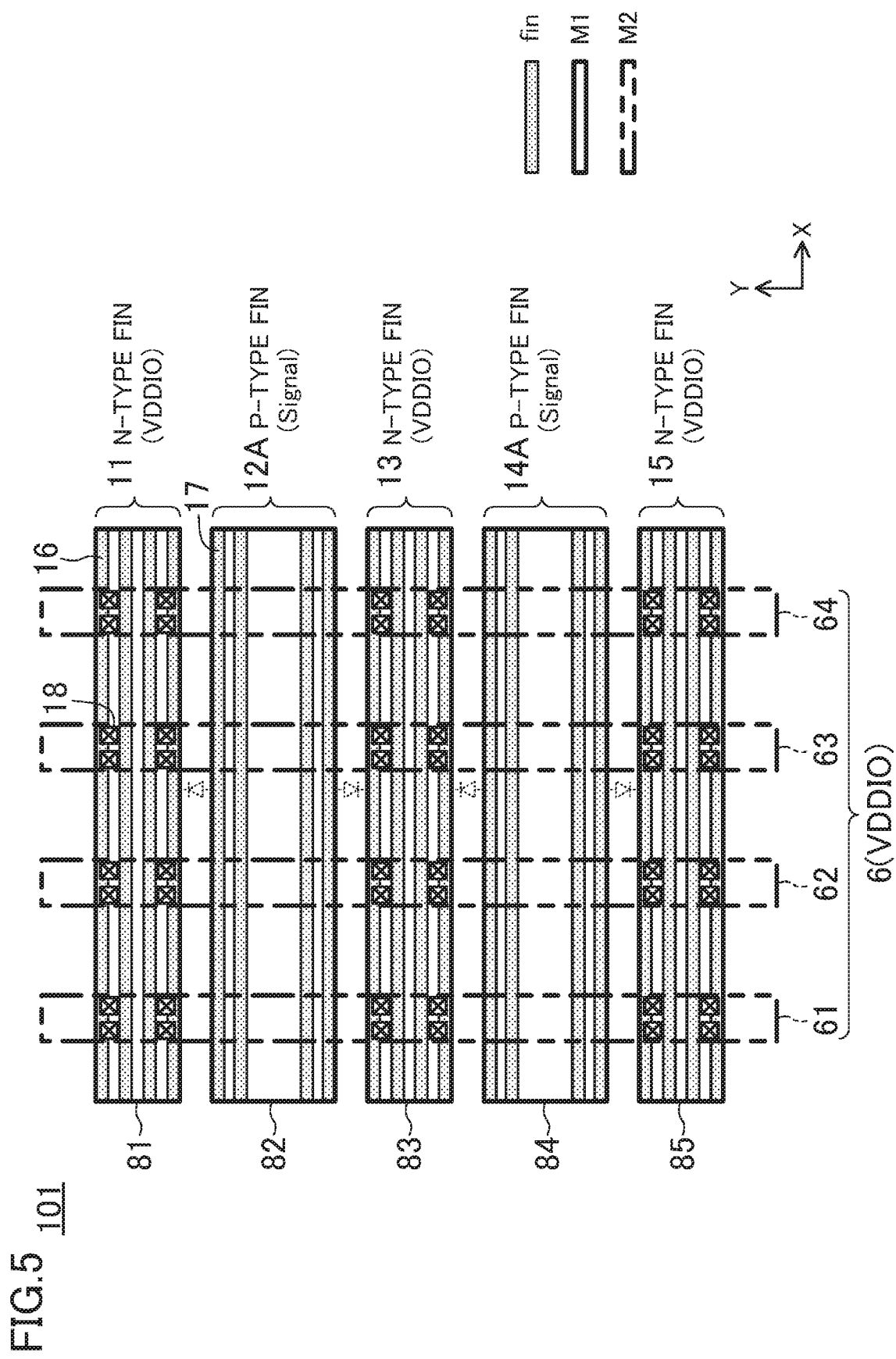

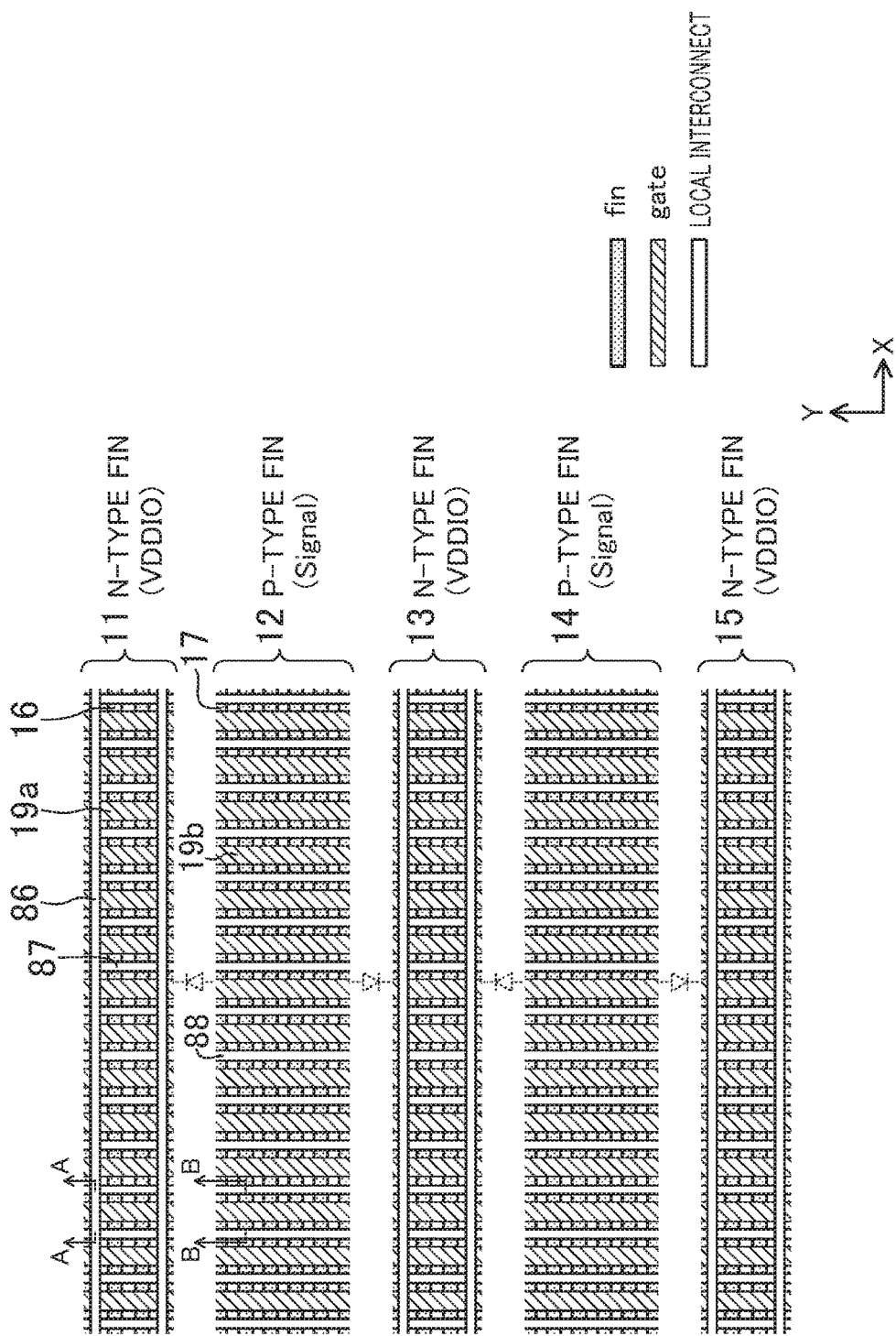

A CROSS SECTION

B CROSS SECTION

SEMICONDUCTOR INTEGRATED CIRCUIT DEVICE

CROSS-REFERENCE TO RELATED APPLICATIONS

This is a continuation of International Application No. PCT/JP2017/031449 filed on Aug. 31, 2017. The entire disclosure of this application is incorporated by reference herein.

BACKGROUND

The present disclosure relates to a semiconductor integrated circuit device using fin field effect transistors (FETs) or nanowire FETs, and more particularly to a layout configuration of an electrostatic discharge (ESD) protection circuit for protecting a circuit from damage caused by electrostatic discharge.

As shown in FIG. 14, an ESD protection circuit 251, 252 is generally provided between a signal terminal (input/output terminal) 253 and a power supply terminal 254 or between the signal terminal 253 and a grounding terminal 255. For an ESD protection circuit, various kinds of protection elements are used depending on its use. Among others, a diode is often used as the protection element for its good discharge characteristics.

SUMMARY

An objective of the present disclosure is providing an ESD protection circuit using a diode having good discharge characteristics.

In the first form of the present disclosure, a semiconductor integrated circuit device provided with fin field effect transistors (FETs) includes an electrostatic discharge (ESD) protection circuit. The ESD protection circuit includes: a first fin structure having a plurality of fins of a first conductivity type that extend in a first direction and are placed side by side in a second direction perpendicular to the first direction; a second fin structure having a plurality of fins of a second conductivity type that extend in the first direction and are placed side by side in the second direction, the second fin structure being opposed to the first fin structure in the second direction; a first power interconnect for power supply that is formed in a first interconnect layer located above the first and second fin structures, extends in a third direction, and is connected with the first fin structure; a first signal interconnect for signal transfer that is formed in the first interconnect layer, extends in the third direction, and is connected with the second fin structure; and a second power interconnect for power supply that is formed in a second interconnect layer located above the first interconnect layer, extends in a fourth direction perpendicular to the third direction, and is connected with the first power interconnect. The width occupied by the second fin structure in the second direction is greater than the width occupied by the first fin structure, and the width of the first signal interconnect in the fourth direction is greater than the width of the first power interconnect.

According to the above form, the semiconductor integrated circuit device provided with fin FETs includes the ESD protection circuit including the first fin structure having a plurality of fins of the first conductivity type that extend in the first direction and are placed side by side in the second direction and the second fin structure having a plurality of fins of the second conductivity type that extend in the first direction and are placed side by side in the second direction. The first fin structure is connected with the first and second power interconnects, and the second fin structure is connected with the first signal interconnect. The first fin structure and the second fin structure are opposed to each other in the second direction. The width occupied by the second fin structure is greater than the width occupied by the first fin structure, and the width of the first signal interconnect is greater than the width of the first power interconnect. Having such a configuration, since a large current is allowed to flow swiftly to a diode at the time of occurrence of an ESD event, damage to internal circuits can be effectively prevented or reduced.

In the second form of the present disclosure, a semiconductor integrated circuit device provided with nanowire field effect transistors (FETs) includes an electrostatic discharge (ESD) protection circuit. The ESD protection circuit includes: a first pad structure having a plurality of rows of pads of a first conductivity type that extend in a first direction and are placed side by side in a second direction perpendicular to the first direction; a second pad structure having a plurality of rows of pads of a second conductivity type that extend in the first direction and are placed side by side in the second direction, the second pad structure being opposed to the first pad structure in the second direction; a first power interconnect for power supply that is formed in a first interconnect layer located above the first and second pad structures, extends in a third direction, and is connected with the first pad structure; a first signal interconnect for signal transfer that is formed in the first interconnect layer, extends in the third direction, and is connected with the second pad structure; and a second power interconnect for power supply that is formed in a second interconnect layer located above the first interconnect layer, extends in a fourth direction perpendicular to the third direction, and is connected with the first power interconnect. The width occupied by the second pad structure in the second direction is greater than the width occupied by the first pad structure, and the width of the first signal interconnect in the fourth direction is greater than the width of the first power interconnect.

According to the above form, the semiconductor integrated circuit device provided with nanowire FETs includes the ESD protection circuit including the first pad structure having a plurality of rows of pads of the first conductivity type that extend in the first direction and are placed side by side in the second direction and the second pad structure having a plurality of rows of pads of the second conductivity type that extend in the first direction and are placed side by side in the second direction. The first pad structure is connected with the first and second power interconnects, and the second pad structure is connected with the first signal interconnect. The first pad structure and the second pad structure are opposed to each other in the second direction. The width occupied by the second pad structure is greater than the width occupied by the first pad structure, and the width of the first signal interconnect is greater than the width of the first power interconnect. Having such a configuration, since a large current is allowed to flow swiftly to a diode at the time of occurrence of an ESD event, damage to internal circuits can be effectively prevented or reduced.

In the third form of the present disclosure, a semiconductor integrated circuit device provided with fin field effect transistors (FETs) includes an electrostatic discharge (ESD) protection circuit. The ESD protection circuit includes: a first fin structure having a plurality of fins of a first conductivity type that extend in a first direction and are placed side by side in a second direction perpendicular to the first direction and a gate formed above the fins to extend in the second direction; a second fin structure having a plurality of fins of a second conductivity type that extend in the first direction and are placed side by side in the second direction and a gate formed above the fins to extend in the second direction, the second fin structure being opposed to the first fin structure in the second direction; a first power interconnect for power supply that is formed in a first interconnect layer located above the first and second fin structures, extends in a third direction, and is connected with the first fin structure; a first signal interconnect for signal transfer that is formed in the first interconnect layer, extends in the third direction, and is connected with the second fin structure; and a second power interconnect for power supply that is formed in a second interconnect layer located above the first interconnect layer, extends in a fourth direction perpendicular to the third direction, and is connected with the first power interconnect. In the second fin structure, the gate is floating.

According to the above form, the semiconductor integrated circuit device provided with fin FETs includes the ESD protection circuit including the first fin structure having a plurality of fins of the first conductivity type that extend in the first direction and are placed side by side in the second direction and the second fin structure having a plurality of fins of the second conductivity type that extend in the first direction and are placed side by side in the second direction. The first fin structure is connected with the first and second power interconnects, and the second fin structure is connected with the first signal interconnect. The first fin structure and the second fin structure are opposed to each other in the second direction. In the second fin structure, the gate formed above the fins to extend in the second direction is floating. Having such a configuration, it is possible to achieve the ESD protection function while preventing or reducing increase in the load capacitance of the signal interconnect.

According to the present disclosure, since the ESD protection circuit permits swift flow of a large current to a diode at the time of occurrence of an ESD event, damage to internal circuits can be effectively prevented or reduced.

BRIEF DESCRIPTION OF THE DRAWINGS

FIG. 1 is a plan view diagrammatically showing the entire configuration of a semiconductor integrated circuit device of an embodiment.

FIGS. 2A and 2B show simple configurations of signal IO cells in FIG. 1.

FIG. 3 is a view showing a configuration of an ESD portion for VDDIO according to the first embodiment.

FIG. 4 is a view showing a configuration of an ESD portion for VSS according to the first embodiment.

FIG. 5 is a view showing a configuration of an ESD portion for VDDIO according to Alteration 1 of the first embodiment.

FIG. 7 is a detailed view of the configuration of FIG. 6.

DETAILED DESCRIPTION

Embodiments of the present disclosure will be described hereinafter with reference to the accompanying drawings.

Figure 15:
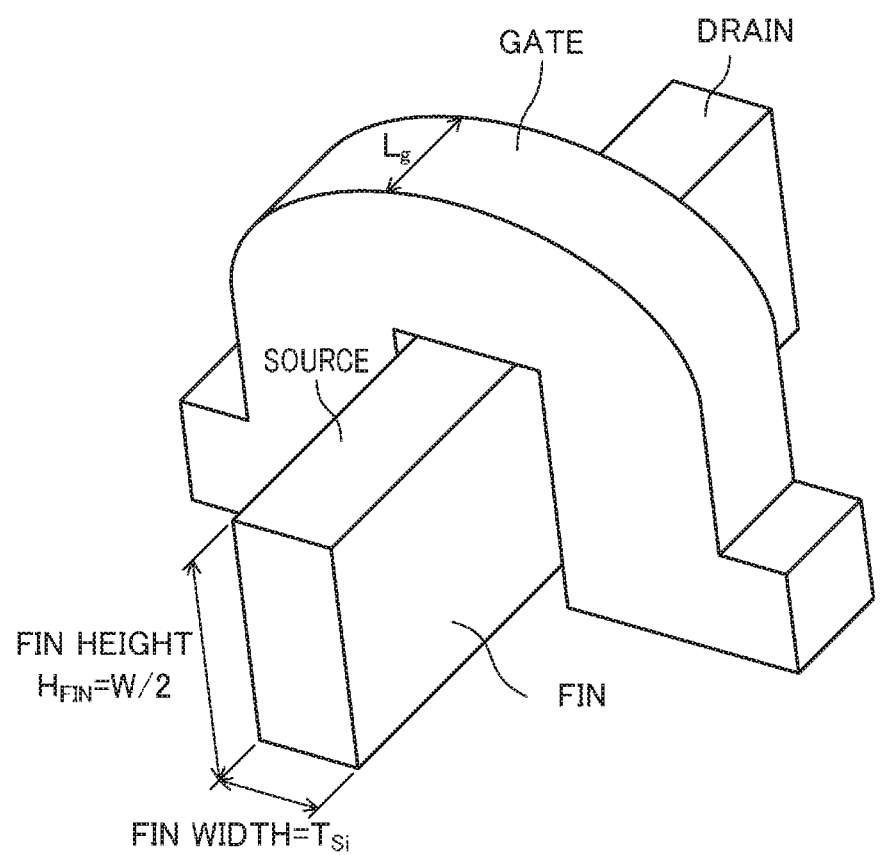
FIG. 15 is a diagrammatic view showing a basic structure of a fin FET.

In recent years, use of FETs having a fin structure (hereinafter referred to as fin FETs) has been proposed in the field of semiconductor devices. FIG. 15 is a diagrammatic view showing an outline of a fin FET. Unlike a FET having a two-dimensional structure, the source and drain of the fin FET have a three-dimensional structure called a fin. A gate is placed to surround the fin. Having such a fin structure, where the channel region is formed of three faces of the fin, the controllability of the channel greatly improves compared to that of conventional ones. This brings about effects such as reduction in leakage power, improvement of ON current, and reduction in operating voltage, thereby improving the performance of the semiconductor integrated circuit.

The fin FET is one type of the so-called three-dimensional transistor device having a three-dimensional diffusion layer portion. As another type of the three-dimensional transistor device, there is a structure called a nanowire FET, for example.

Figure 16:
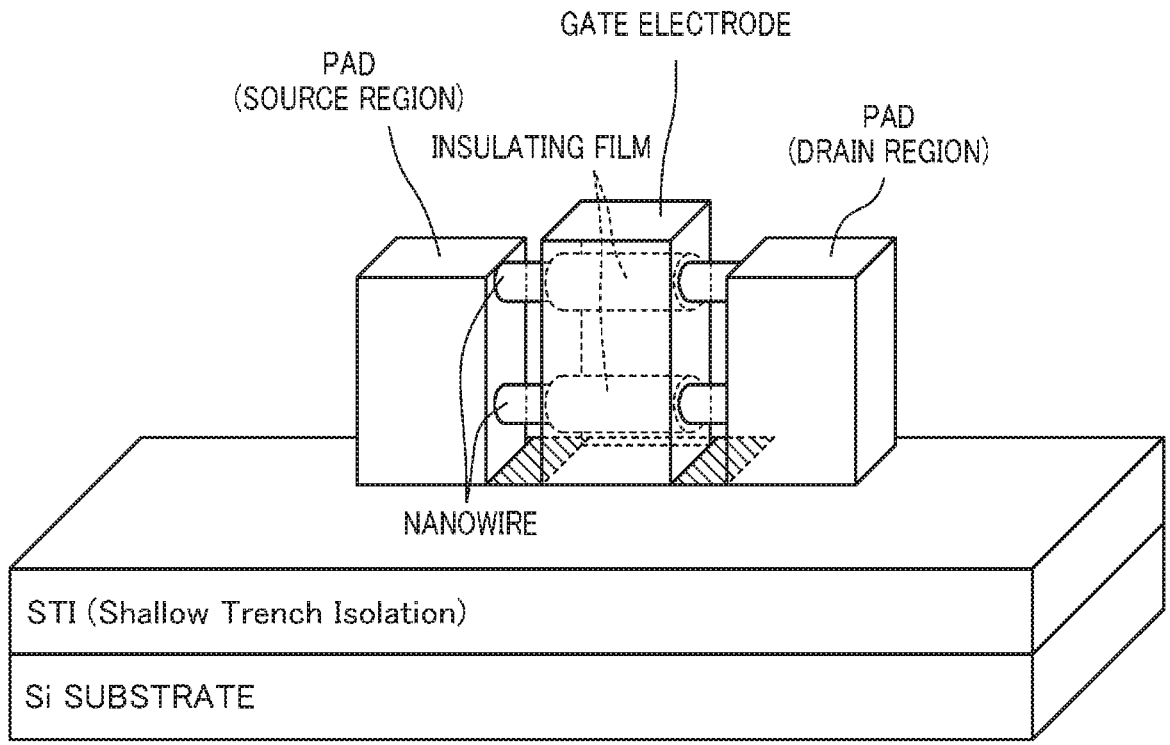
FIG. 16 is a diagrammatic view showing a basic structure of a nanowire FET.

FIG. 16 is a diagrammatic view showing an example of a basic structure of a nanowire FET (also referred to as a gate all around (GAA) structure). The nanowire FET is a FET using fine wires (nanowires) through which a current flows. The nanowires are formed of silicon, for example. As shown in FIG. 16, the nanowires are formed to extend above a substrate in the horizontal direction, i.e., in parallel with the substrate, and connected, at both ends, to structures that are to be a source region and drain region of the nanowire FET. As used herein, the structures that are connected to both ends of the nanowires and are to be the source region and drain region of the nanowire FET are referred to as the pads. In FIG. 16, while shallow trench isolation (STI) is formed on the silicon substrate, the silicon substrate is exposed in portions below the nanowires (hatched portions). Actually, the hatched portions may be covered with a thermally-oxidized film, etc. Illustration of such a film is however omitted in FIG. 16 for the sake of simplification.

The nanowires are surrounded by a gate electrode made of polysilicon, for example, via insulating films such as silicon oxide films. The pads and the gate electrode are formed on the surface of the substrate. With this structure, since the channel regions of the nanowires are covered with the gate electrode in all of their top portions, side portions, and bottom portions, the electric field will be applied uniformly over the channel regions, thereby improving the switching characteristics of the FET.

Note that, while at least the portions of the pads to which the nanowires are connected serve as the source/drain regions, portions thereof lower than the nanowire-connected portions may not necessarily serve as the source/drain regions. Also, part of the nanowires (portions that are not surrounded by the gate electrode) may serve as the source/drain regions.

In FIG. 16, two nanowires are placed in the vertical direction, i.e. in the direction perpendicular to the substrate. The number of nanowires placed in the vertical direction is not limited to two, but it may be one. Otherwise, three or more nanowires may be placed side by side in the vertical direction. Also, in FIG. 16, the top of the upper nanowire and the tops of the pads are in line with each other. However, it is unnecessary to align the positions of the tops, but the tops of the pads may be located higher than the top of the upper nanowire.

Figure 17:
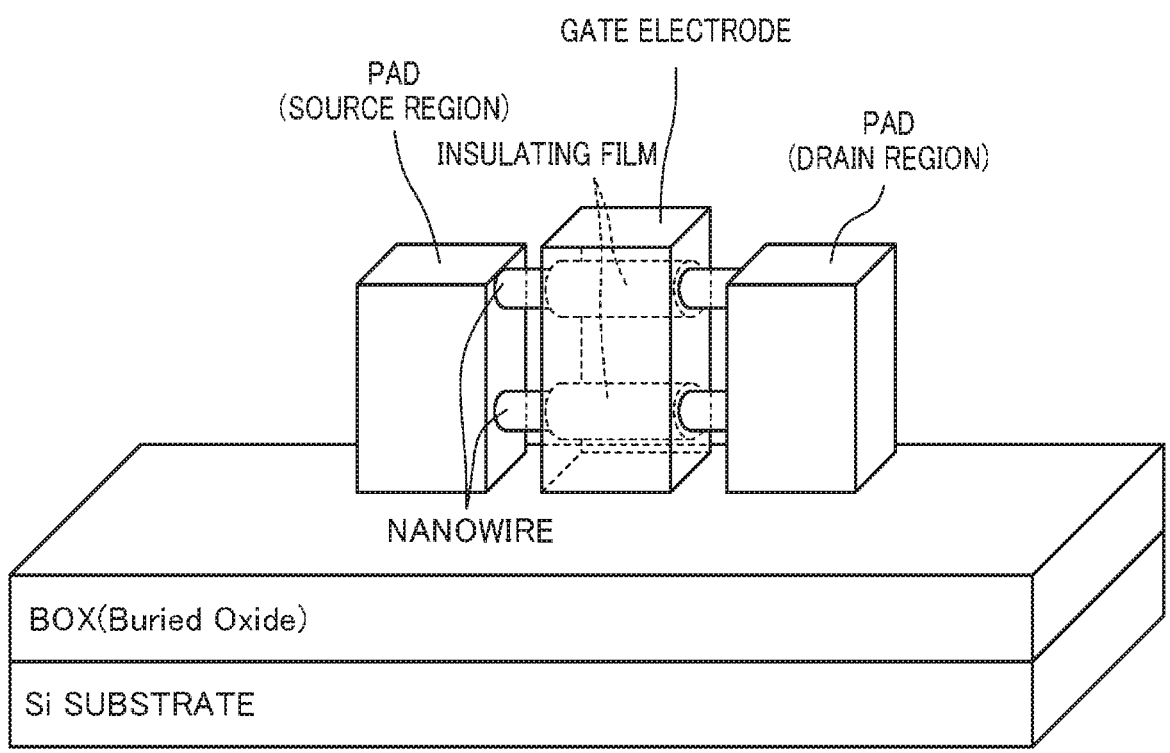
FIG. 17 is a diagrammatic view showing a basic structure of another nanowire FET.

Also, as shown in FIG. 17, buried oxide (BOX) may be formed on the top surface of the substrate, and the nanowire FET may be formed on this BOX.

First Embodiment

FIG. 1 is a plan view diagrammatically showing the entire configuration of a semiconductor integrated circuit device (semiconductor chip) according to an embodiment. In FIG. 1, the horizontal direction as viewed from the figure is referred to as the X direction, and the vertical direction as the Y direction (this also applies to the subsequent figures). The semiconductor integrated circuit device 1 shown in FIG. 1 has a core region 2 in which internal core circuits are formed and an IO region 3, surrounding the core region 2, in which interface circuits (IO circuits) are formed. In the IO region 3, an IO cell row 5 is provided along the periphery of the semiconductor integrated circuit device 1. Although illustration is omitted in FIG. 1, the IO cell row 5 includes a plurality of IO cells 10 that constitute the interface circuits, placed in a line.

The IO cells 10 include signal IO cells for input, output, or input/output of signals, power supply IO cells for supply of the grounding potential (power supply voltage VSS), and power supply IO cells for supply of power (power supply voltage VDDIO) mainly to the IO region 3. VDDIO is 3.3 V, for example. In FIG. 1, an IO cell 10A for signal input/output is placed on the right side as viewed from the figure, and an IO cell 10B for signal input/output is placed on the lower side as viewed from the figure.

In the IO region 3, power interconnects 6 and 7 are provided extending in the direction in which the IO cells 10 line up. The power interconnects 6 and 7 are each formed in a ring shape along the periphery of the semiconductor integrated circuit device 1 (also referred to as the ring power interconnects). The power interconnect 6 supplies VDDIO and the power interconnect 7 supplies VSS. Although the power interconnects 6 and 7 are illustrated like single interconnects in FIG. 1, they each may actually be constituted by a plurality of interconnects. Also, although illustration is omitted in FIG. 1, a plurality of pads for external connection are provided in the semiconductor integrated circuit device 1.

FIGS. 2A and 2B show simple configurations of the IO cells 10A and 10B. It is assumed in the subsequent description that the power interconnects 6 and 7 are each constituted by four interconnects. As shown in FIG. 2A, the power interconnects 6 and 7 extend in the Y direction in the IO cell 10A. The IO cell 10A has an ESD portion 101 for VDDIO under the power interconnect 6 and an ESD portion 102 for VSS under the power interconnect 7. The ESD portion 101 for VDDIO and the ESD portion 102 for VSS are provided at positions closer to the outside of the chip in the IO cell 10A. Also, as shown in FIG. 2B, the power interconnects 6 and 7 extend in the X direction in the IO cell 10B. The IO cell 10B has an ESD portion 103 for VDDIO under the power interconnect 6 and an ESD portion 104 for VSS under the power interconnect 7. The ESD portion 103 for VDDIO and the ESD portion 104 for VSS are provided at positions closer to the outside of the chip in the IO cell 10B.

In this embodiment, assume that the semiconductor integrated circuit device 1 has fin FETs. The configuration of an ESD protection circuit according to this embodiment will be described taking, as examples, the ESD portion 101 for VDDIO and the ESD portion 102 for VSS in the IO cell 10A shown in FIG. 2A.

FIG. 3 is a view showing the configuration of the ESD portion 101 for VDDIO according to this embodiment. In FIG. 3, the reference numerals 11, 13, and 15 denote fin structures including n-conductivity type fins 16. The fin structures 11, 13, and 15 (first fin structures) each include four fins 16 that extend in the X direction (corresponding to the first direction) and are placed side by side in the Y direction (corresponding to the second direction). The reference numerals 12 and 14 denote fin structures including p-conductivity type fins 17. The fin structures 12 and 14 (second fin structures) each include six fins 17 that extend in the X direction and are placed side by side in the Y direction. The fin structure 12 is opposed to the fin structures 11 and 13 in the Y direction, and the fin structure 14 is opposed to the fin structures 13 and 15 in the Y direction.

In an interconnect layer M1 located above the fins 16 and 17, interconnects 81, 82, 83, 84, and 85 are formed extending in the X direction (corresponding to the third direction). The interconnect 81 is formed above the fin structure 11 and connected with the fin structure 11. Similarly, the interconnects 82, 83, 84, and 85 are respectively formed above the fin structures 12, 13, 14, and 15 and connected with the fin structures 12, 13, 14, and 15. The interconnects in the interconnect layer M1 and the fin structures are connected together via contacts and local interconnects not shown.

In an interconnect layer M2 located above the interconnect layer M1, four interconnects 61, 62, 63, and 64 (second power interconnects) constituting the above-described power interconnect 6 are formed to extend in the Y direction (corresponding to the fourth direction). The interconnects 61, 62, 63, and 64 are connected with the interconnects 81, 83, and 85 (first power interconnects) in the interconnect layer M1 via contacts 18. In this embodiment, the direction in which the interconnects 81, 82, 83, 84, and 85 in the interconnect layer M1 extend is the same as the direction in which the fins 16 and 17 extend (X direction), and the direction in which the interconnects 61, 62, 63, and 64 in the interconnect layer M2 extend is the same as the direction in which the fins 16 and 17 are placed side by side (Y direction).

The power supply voltage VDDIO is supplied to the fin structures 11, 13, and 15 from the interconnects 61, 62, 63, and 64 constituting the power interconnect 6 via the interconnects 81, 83, and 85. Input/output signals are supplied to the fin structures 12 and 14 from external pads (not shown) connected to the outside of the chip via the interconnects 82 and 84 (first signal interconnects).

A diode is formed between the fin structure 11 and the fin structure 12 opposed in the Y direction. Similarly, diodes are each formed between the opposed fin structures 12 and 13, between the opposed fin structures 13 and 14, and between the opposed fin structures 14 and 15. The ESD protection function is achieved by these diodes.

In the configuration of FIG. 3, the number of fins 17 (six in the illustrated example) of each of the fin structures 12 and 14 to which input/output signals are supplied is greater than the number of fins 16 (four in the illustrated example) of each of the fin structures 11, 13, and 15 to which power is supplied, and the width occupied by the fin structures 12 and 14 each in the Y direction is greater than the width occupied by the fin structures 11, 13, and 15 each. Also, the width of the interconnects 82 and 84 as the signal interconnects in the Y direction is greater than the width of the interconnects 81, 83, and 85 as the power interconnects. Having such a configuration, since a large current is allowed to flow swiftly to the diodes at the time of occurrence of an ESD event, damage to internal circuits can be effectively prevented or reduced.

FIG. 4 is a view showing the configuration of the ESD portion 102 for VSS according to this embodiment. The configuration of the ESD portion 102 for VSS shown in FIG. 4 is similar to the configuration of the ESD portion 101 for VDDIO shown in FIG. 3 except that the power supply voltage is VSS and the conductivity types (p/n) of the fin structures are reversed. Specifically, in FIG. 4, the reference numerals 21, 23, and 25 denote fin structures including p-type fins 26. The fin structures 21, 23, and 25 (first fin structures) each include four fins 26 that extend in the X direction (corresponding to the first direction) and are placed side by side in the Y direction (corresponding to the second direction). The reference numerals 22 and 24 denote fin structures including n-type fins 27. The fin structures 22 and 24 (second fin structures) each include six fins 27 that extend in the X direction and are placed side by side in the Y direction. The fin structure 22 is opposed to the fin structures 21 and 23 in the Y direction, and the fin structure 24 is opposed to the fin structures 23 and 25 in the Y direction.

In the interconnect layer M1 located above the fins 26 and 27, interconnects 91, 92, 93, 94, and 95 are formed extending in the X direction (corresponding to the third direction). The interconnect 91 is formed above the fin structure 21 and connected with the fin structure 21. Similarly, the interconnects 92, 93, 94, and 95 are respectively formed above the fin structures 22, 23, 24, and 25 and connected with the fin structures 22, 23, 24, and 25.

In the interconnect layer M2 located above the interconnect layer M1, four interconnects 71, 72, 73, and 74 (second power interconnects) constituting the above-described power interconnect 7 extend in the Y direction (corresponding to the fourth direction). The interconnects 71, 72, 73, and 74 are connected with the interconnects 91, 93, and 95 (first power interconnects) in the interconnect layer M1 via contacts 18.

The grounding voltage VSS is supplied to the fin structures 21, 23, and 25 from the interconnects 71, 72, 73, and 74 constituting the power interconnect 7 via the interconnects 91, 93, and 95. Input/output signals are supplied to the fin structures 22 and 24 from external pads (not shown) connected to the outside of the chip via the interconnects 92 and 94 (first signal interconnects).

A diode is formed between the fin structure 21 and the fin structure 22 opposed in the Y direction. Similarly, diodes are each formed between the opposed fin structures 22 and 23, between the opposed fin structures 23 and 24, and between the opposed fin structures 24 and 25. The ESD protection function is achieved by these diodes.

In the configuration of FIG. 4, the number of fins 27 (six) of each of the fin structures 22 and 24 to which input/output signals are supplied is greater than the number of fins 26 (four) of each of the fin structures 21, 23, and 25 to which power is supplied, and the width occupied by the fin structures 22 and 24 each in the Y direction is greater than the width occupied by the fin structures 21, 23, and 25 each. Also, the width of the interconnects 92 and 94 as the signal interconnects in the Y direction is greater than the width of the interconnects 91, 93, and 95 as the power interconnects. Having such a configuration, since a large current is allowed to flow swiftly to the diodes at the time of occurrence of an ESD event, damage to internal circuits can be effectively prevented or reduced.

(Alteration 1)

FIG. 5 is a view showing a configuration of an ESD portion 101 for VDDIO according to Alteration 1. The configuration of FIG. 5 is substantially similar to the configuration of FIG. 3, except that the number of fins 17 in fin structures 12A and 14A to which input/output signals are supplied is reduced compared to the fin structures 12 and 14 in FIG. 3. Specifically, the fin structures 12A and 14A each have four fins 17 omitting two fins in the center in the Y direction. However, the width occupied by the fin structures 12A and 14A each in the Y direction is the same as that occupied by the fin structures 12 and 14 each in FIG. 3. That is, the fin structures 12A and 14A have a portion in which the fin spacing is wider than that in the fin structures 11, 13, and 15.

In a fin structure, a fin thereof closer to an opposed fin structure contributes to diode formation more greatly, and the contribution to diode formation becomes smaller as the fin is located farther from an opposed fin structure. Therefore, even though the fins in the center apart from the opposed fin structures 11, 13, and 15 are eliminated as in the fin structures 12A and 14A in FIG. 5, the performance of formed diodes does not greatly decrease. Meanwhile, in this alteration, since the number of fins connected to the interconnects 82 and 84 as the signal interconnects decreases, the load capacitance for the signal interconnects decreases. This permits higher-speed signal input/output and also reduction in power consumption.

(Alteration 2)

Figure 6:
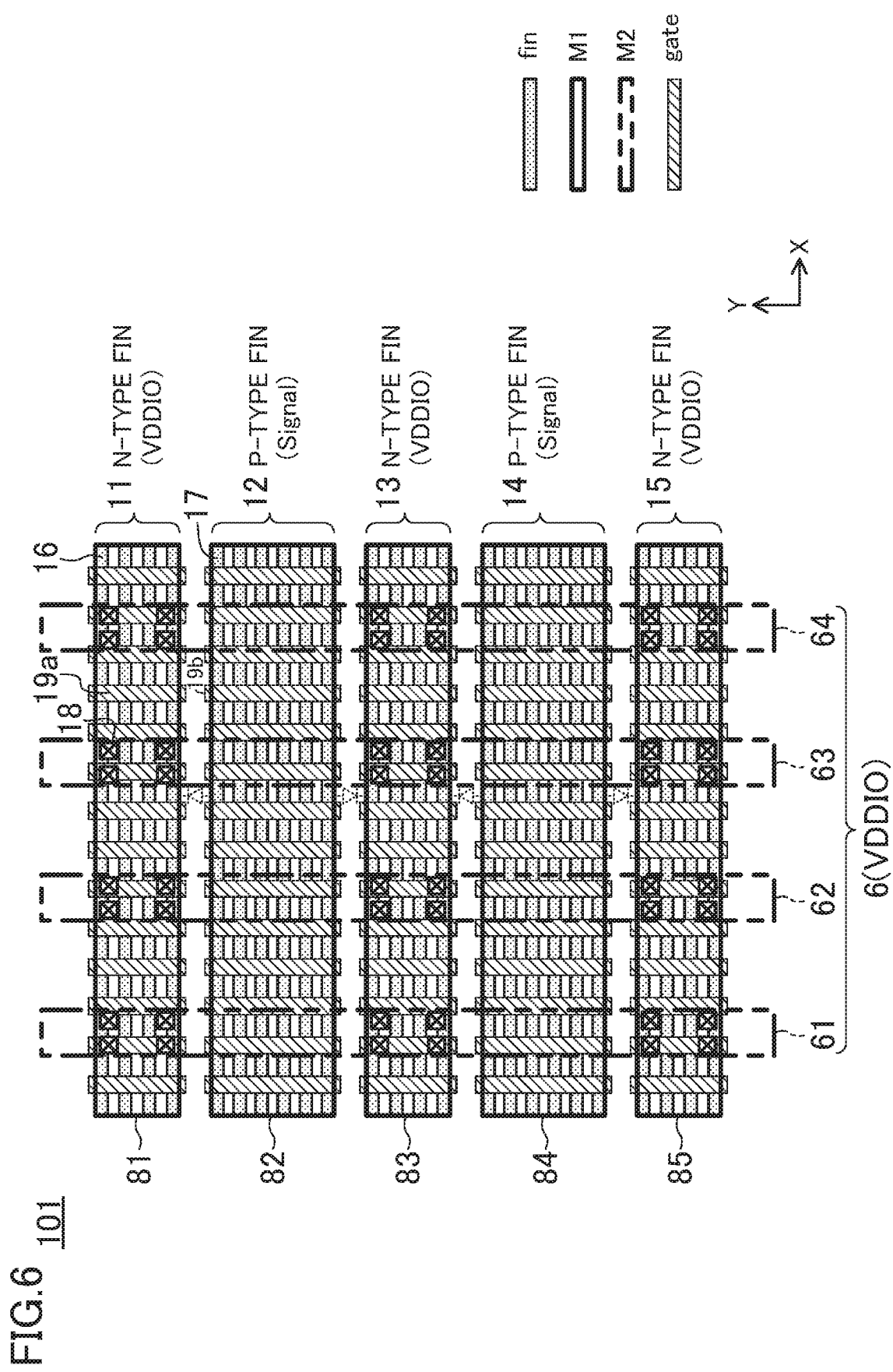
FIG. 6 is a view showing a configuration of an ESD portion for VDDIO according to Alteration 2 of the first embodiment.

FIG. 6 is a view showing a configuration of an ESD portion 101 for VDDIO according to Alteration 2. The configuration of FIG. 6 is substantially similar to the configuration of FIG. 3, except that gates 19a extending in the Y direction are formed above the fins 16 in the fin structures 11, 13, and 15, and gates 19b extending in the Y direction are formed above the fins 17 in the fin structures 12 and 14. That is, the fin structures 11 to 15 include the same structures as fin FETs constituted by the fins 16 and 17 and the gates 19a and 19b.

Figure 8A:
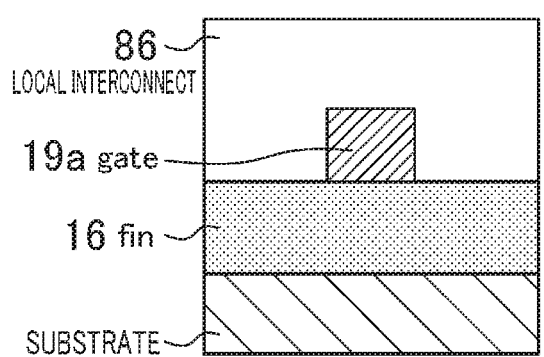
FIGS. 8A and 8B are cross-sectional views of the configuration of FIG. 7.
Figure 8B:
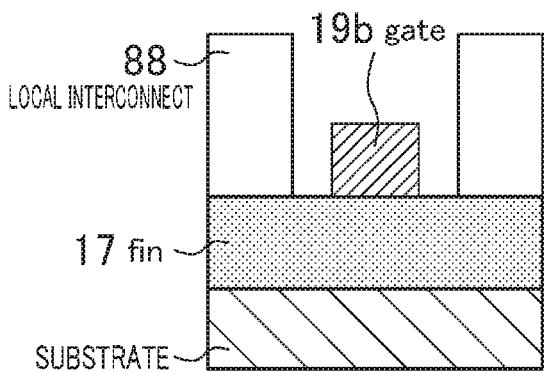

FIG. 7 is a view showing the details of a configuration of layers lower than the interconnect layer M1 in the configuration of FIG. 6. In FIG. 7, shown are local interconnects 86, 87, and 88 for connecting the fins 16 and 17 and the gates 19 with the interconnects in the interconnect layer M1. FIGS. 8A and 8B are diagrammatic cross-sectional views of the configuration of FIG. 7, where FIG. 8A is a cross-sectional view taken along line A-A in the fin structure 11 and FIG. 8B is a cross-sectional view taken along line B-B in the fin structure 12.

In the fin structures 11, 13, and 15, the local interconnects 86 extending in the X direction connect the fins 16 and the gates 19a with the interconnects 81, 83, and 85 in the interconnect layer M1. The local interconnects 87 extending in the Y direction connect the fins 16 with the interconnects 81, 83, and 85 in the interconnect layer M1. In the fin structures 12 and 14, the local interconnects 88 extending in the Y direction connect the fins 17 with the interconnects 82 and 84 in the interconnect layer M1. The gates 19b are connected with no local interconnects and thus not connected with the interconnects 82 and 84 in the interconnect layer M1. That is, while the power supply voltage VDDIO supplied to the fins 16 is also supplied to the gates 19a in the fin structures 11, 13, and 15, the gates 19b are floating in the fin structures 12 and 14.

Having the above configuration, the ESD portion 101 for VDDIO can be formed in a process similar to the process for fin FETs in other portions of the semiconductor integrated circuit device 1. Also, since variations in the roughness of the gates can be prevented or reduced, the precision of the finished dimensions of the gate shape can be improved.

Lower portions of the gates 19a and 19b may be doped with impurities of the same conductivity type as the fins 16 and 17 lying under the gates 19a and 19b. This improves the performance of the diodes formed. Also, although the positions of the gates 19a of the n-type fin structures 11, 13, and 15 in the X direction are aligned with those of the gates 19b of the p-type fin structures 12 and 14 in the configuration of FIG. 6, it is not necessarily required to align the positions of the gates 19a and 19b in the X direction. Note however that, when lower portions of the gates 19a and 19b are not doped with impurities, the performance of the diodes will be more improved when the positions of the gates 19a and 19b in the X direction are aligned in the n-type fin structures 11, 13, and 15 and the p-type fin structures 12 and 14.

Although the power supply voltage VDDIO is supplied to the gates 19a in the fin structures 11, 13, and 15 in the configuration of FIG. 6, the gates 19a may be made floating. Also, although the gates 19b are floating in the fin structures 12 and 14, the same input/output signals as those supplied to the fins 17 may be supplied to the gates 19b. It is however more preferable for the gates 19b to be floating because this state will not increase the load capacitance for the interconnects 82 and 84 as the signal interconnects. Note that another power supply, etc. may be connected to the gates 19b so as not to increase the load capacitance for the signal interconnects.

Figure 9:
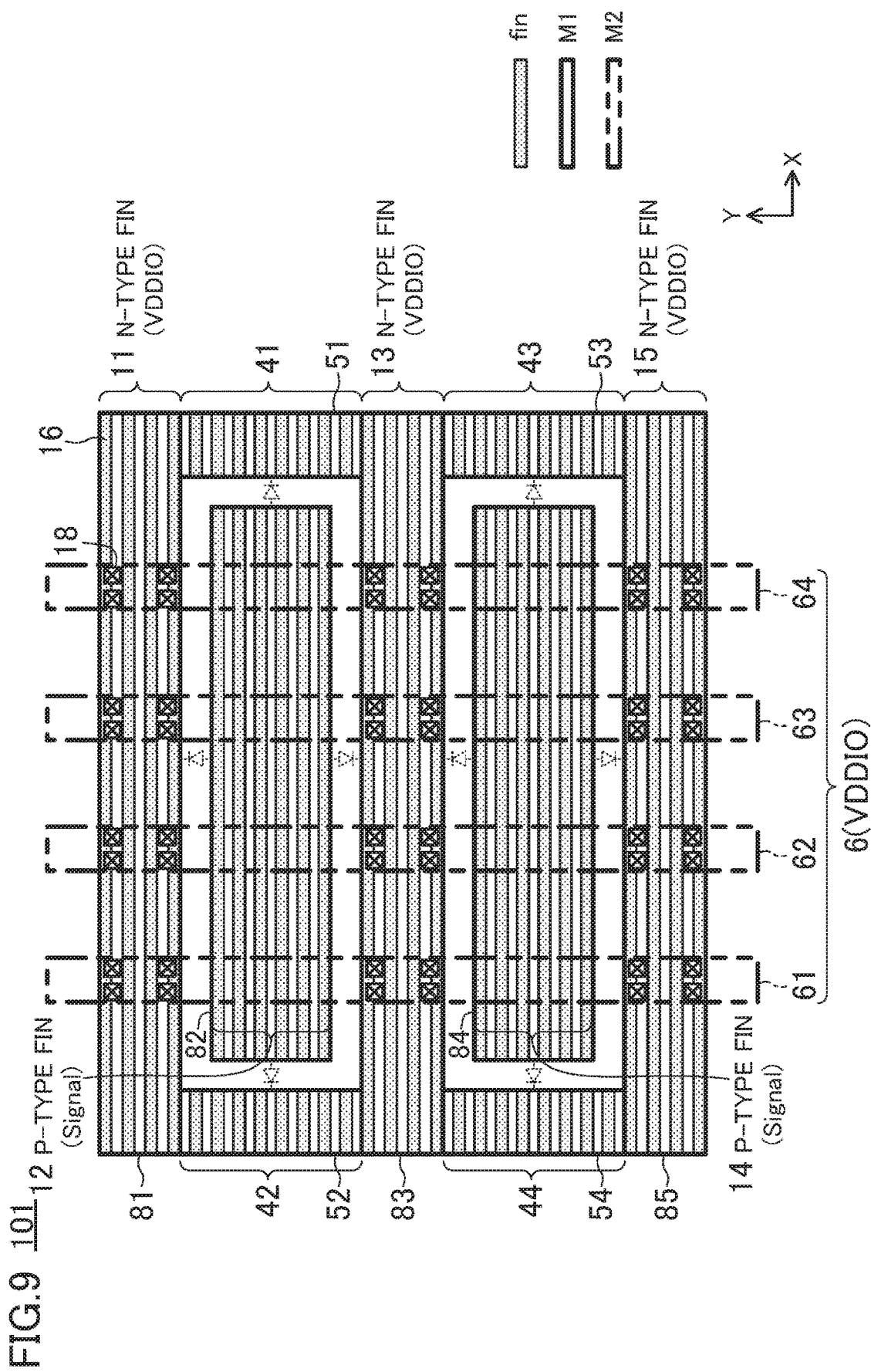
FIG. 9 is a view showing a configuration of an ESD portion for VDDIO according to Alteration 3 of the first embodiment.

(Alteration 3) FIG. 9 is a view showing a configuration of an ESD portion 101 for VDDIO according to Alteration 3. The configuration of FIG. 9 is substantially similar to the configuration of FIG. 3, except that fin structures 41, 42, 43, and 44 each constituted by a plurality of n-type fins 16 are provided on both sides in the X direction of the fin structures 12 and 14 to which input/output signals are supplied. Also, in the interconnect layer M1, interconnects 51, 52, 53, and 54 are provided above the fin structures 41, 42, 43, and 44. The interconnects 51, 52, 53, and 54 are connected with the interconnects 81, 83, and 85 placed above the fin structures 11, 13, and 15.

Having the above configuration, diodes are formed also between the fin structure 12 and the fin structures 41 and 42, and between the fin structure 14 and the fin structures 43 and 44. This can further enhance the ESD protection function.

Note that, while the fin structures 41, 42, 43, and 44 are provided on both sides in the X direction of the fin structures 12 and 14 to which input/output signals are supplied in the configuration of FIG. 9, a fin structure constituted by a plurality of n-type fins 16 may be provided on either one side of each of the fin structures 12 and 14 in the X direction.

Alterations 1 to 3 described above may be applied to the configuration of the ESD portion 102 for VSS in FIG. 4. Also, Alterations 1 to 3 may be applied in combination to the configurations of the ESD portion 101 for VDDIO and the ESD portion 102 for VSS.

Second Embodiment

The entire configuration of a semiconductor integrated circuit device according to the second embodiment is as shown in FIG. 1. In this embodiment, as in the first embodiment, the semiconductor integrated circuit device 1 is assumed to have fin FETs. The configuration of an ESD protection circuit according to this embodiment will be described hereinafter taking, as examples, the ESD portion 103 for VDDIO and the ESD portion 104 for VSS in the IO cell 10B shown in FIG. 2B.

In the manufacturing process of fin FETs, it is generally necessary to make the direction of fins uniform in the entire semiconductor chip. Therefore, in the IO cell 10B, fins are placed to extend in the X direction. For this reason, in this embodiment, the relationship between the direction in which the fins extend and the direction in which the interconnects extend is different from that in the first embodiment.

Figure 10:
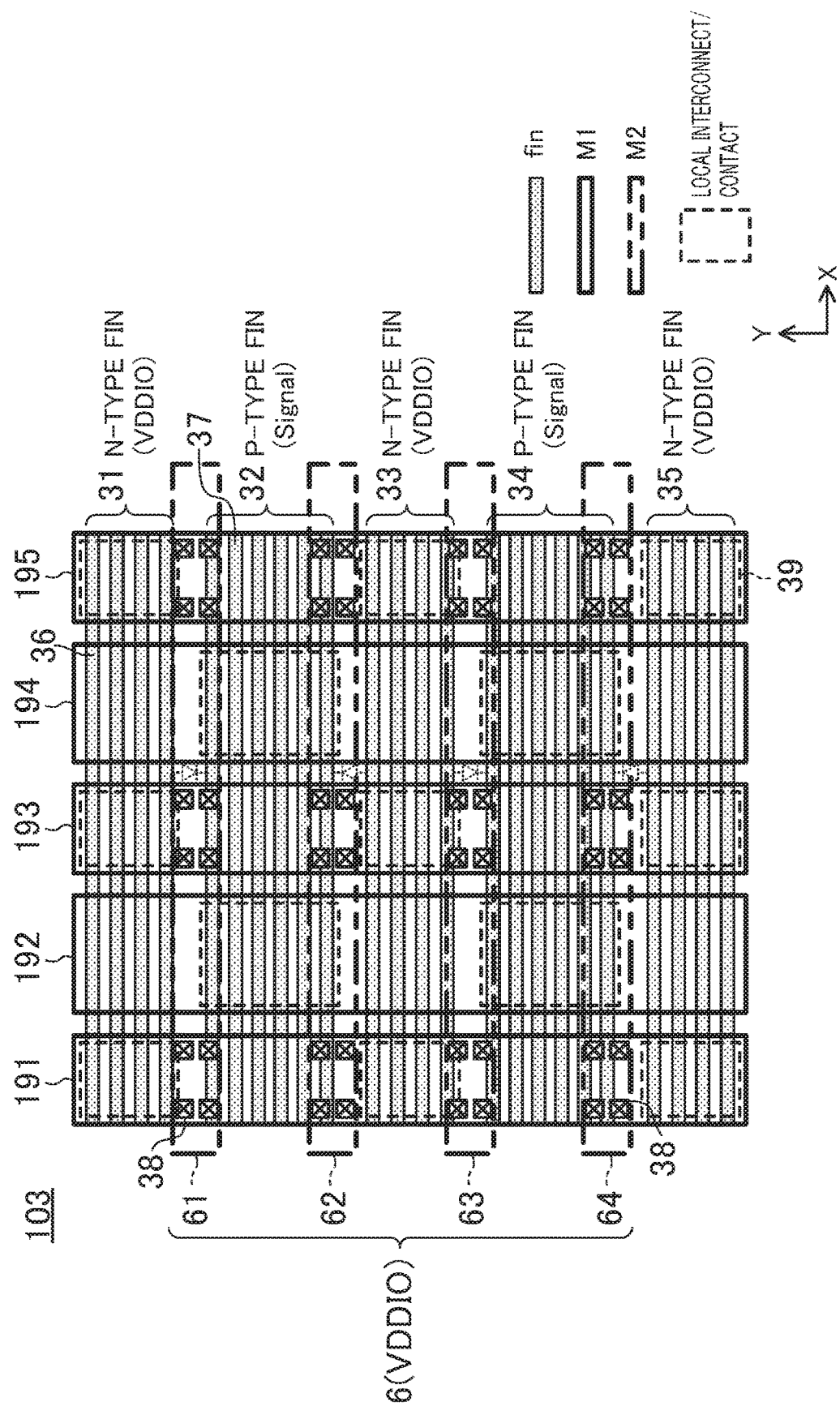
FIG. 10 is a view showing a configuration of an ESD portion for VDDIO according to the second embodiment.

FIG. 10 is a view showing a configuration of the ESD portion 103 for VDDIO according to this embodiment. In FIG. 10, the reference numerals 31, 33, and 35 denote fin structures including n-type fins 36. The fin structures 31, 33, and 35 (first fin structures) each include four fins 36 that extend in the X direction (corresponding to the first direction) and are placed side by side in the Y direction (corresponding to the second direction). The reference numerals 32 and 34 denote fin structures including p-type fins 37. The fin structures 32 and 34 (second fin structures) each include six fins 37 that extend in the X direction and are placed side by side in the Y direction. The fin structure 32 is opposed to the fin structures 31 and 33 in the Y direction, and the fin structure 34 is opposed to the fin structures 33 and 35 in the Y direction.

In an interconnect layer M1 located above the fins 36 and 37, interconnects 191, 192, 193, 194, and 195 extending in the Y direction (corresponding to the third direction) are formed. The interconnects 191, 193, and 195 (first power interconnects) are connected with the fin structures 31, 33, and 35. The interconnects 192 and 194 (first signal interconnects) are connected with the fin structures 32 and 34. The interconnects in the interconnect layer M1 and the fin structures are connected together via connections 39 constituted by contacts and local interconnects. Although the connections 39 are shown as dashed rectangles in FIG. 10 to diagrammatically illustrate the presence of the connections 39, the connections 39 can have an arbitrary shape.

In an interconnect layer M2 located above the interconnect layer M1, four interconnects 61, 62, 63, and 64 constituting the above-described power interconnect 6 are formed to extend in the X direction (corresponding to the fourth direction). The interconnects 61, 62, 63, and 64 (second power interconnects) are connected with the interconnects 191, 193, and 195 in the interconnect layer M1 via contacts 38. The direction in which interconnects 191, 192, 193, 194, and 195 in the interconnect layer M1 extend is the same as the direction in which the fins 36 and 37 are placed side by side (Y direction), and the direction in which the interconnects 61, 62, 63, and 64 in the interconnect layer M2 extend is the same as the direction in which the fins 36 and 37 extend (X direction).

The power supply voltage VDDIO is supplied to the fin structures 31, 33, and 35 from the interconnects 61, 62, 63, and 64 constituting the power interconnect 6 via the interconnects 191, 193, and 195. Input/output signals are supplied to the fin structures 32 and 34 from external pads (not shown) connected to the outside of the chip via the interconnects 192 and 194.

A diode is formed between the fin structure 31 and the fin structure 32 opposed in the Y direction. Similarly, diodes are each formed between the opposed fin structures 32 and 33, between the opposed fin structures 33 and 34, and between the opposed fin structures 34 and 35. The ESD protection function is achieved by these diodes.

In the configuration of FIG. 10, the number of fins 37 (six in the illustrated example) of each of the fin structures 32 and 34 to which input/output signals are supplied is greater than the number of fins 36 (four in the illustrated example) of each of the fin structures 31, 33, and 35 to which power is supplied, and the width occupied by the fin structures 32 and 34 each in the Y direction is greater than the width occupied by the fin structures 31, 33, and 35 each. Also, the width of the interconnects 192 and 194 as the signal interconnects in the X direction is greater than the width of the interconnects 191, 193, and 195 as the power interconnects. Having such a configuration, since a large current is allowed to flow swiftly to the diodes at the time of occurrence of an ESD event, damage to internal circuits can be effectively prevented or reduced.

Also, since the direction in which fins extend is made uniform over the right- and left-side IO cells (e.g., the IO cell 10A) and the upper- and lower-side IO cells (e.g., the IO cell 10B), the number of man-hours for design can be reduced.

Alterations 1 to 3 described in the first embodiment can also be applied to the configuration of the ESD portion 103 for VDDIO in FIG. 10. That is, as in Alteration 1, the number of fins may be reduced in the fin structures 32 and 34. As in Alteration 2, gates extending in the Y direction may be formed above the fins 36 and 37 in the fin structures 31 to 35. Also, as in Alteration 3, fin structures constituted by a plurality of n-type fins 36 may be provided on at least one side of each of the fin structures 32 and 34 in the X direction.

For the ESD portion 104 for VSS, although illustration is omitted here, the power supply voltage may be changed to VSS and the conductivity types (p/n) of the fin structures may be reversed from the configuration of FIG. 10, as in the case of the ESD portion 102 for VSS in FIG. 4 in the first embodiment. Alternations 1 to 3 described in the first embodiment may also be applied to the configuration of the ESD portion 104 for VSS. Also, Alterations 1 to 3 in the first embodiment may be applied in combination to the configurations of the ESD portion 103 for VDDIO and the ESD portion 104 for VSS.

Third Embodiment

The entire configuration of a semiconductor integrated circuit device according to the third embodiment is as shown in FIG. 1. In this embodiment, the semiconductor integrated circuit device 1 is assumed to have nanowire FETs. The configuration of an ESD protection circuit according to this embodiment will be described hereinafter taking, as examples, the ESD portion 101 for VDDIO and the ESD portion 102 for VSS in the IO cell 10A shown in FIG. 2A.

Figure 11:
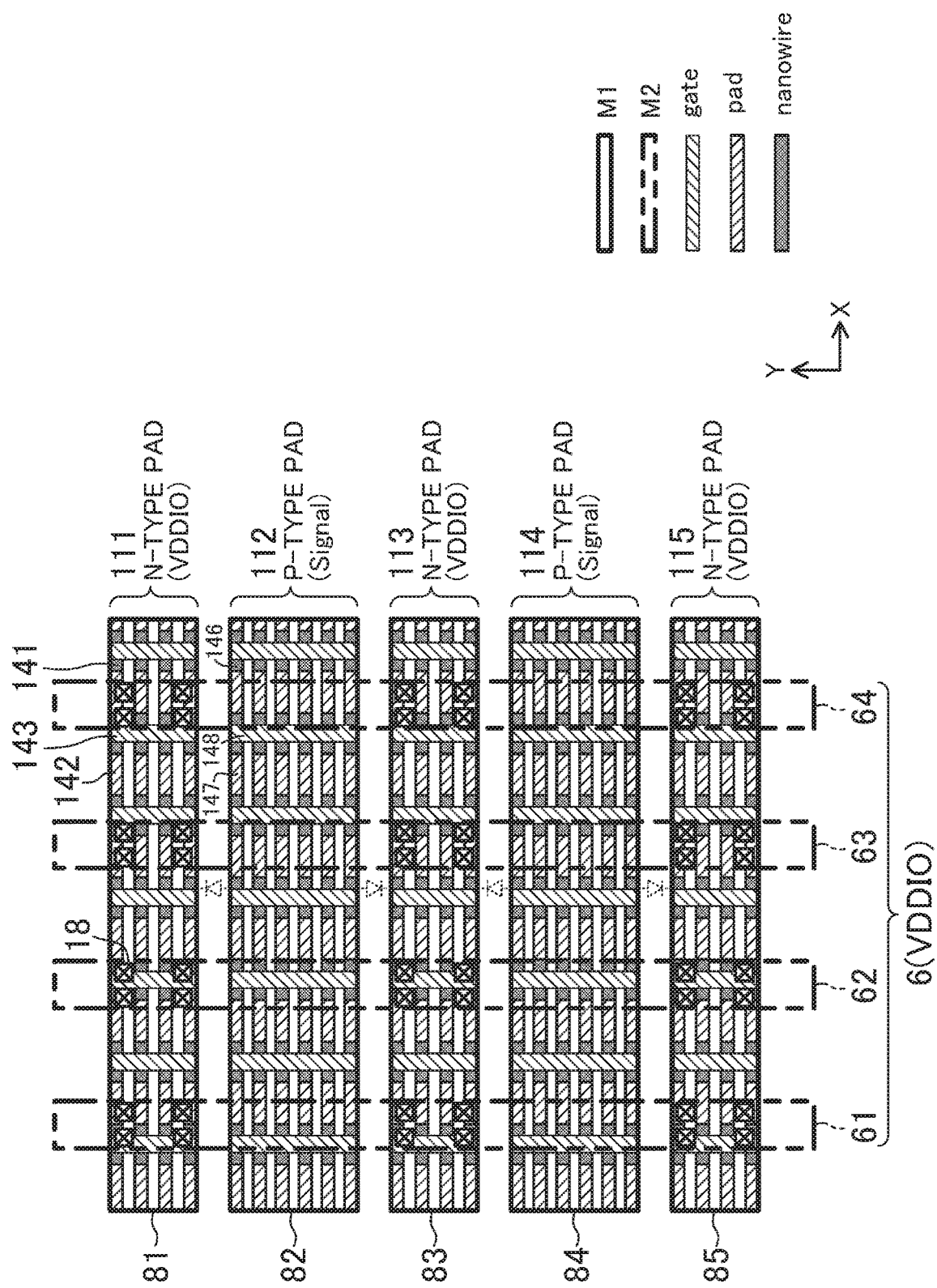
FIG. 11 is a view showing a configuration of an ESD portion for VDDIO according to the third embodiment.

FIG. 11 is a view showing the configuration of the ESD portion 101 for VDDIO according to this embodiment. In FIG. 11, the reference numerals 111, 113, and 115 denote pad structures including n-type pads. The pad structures 111, 113, and 115 (first pad structures) each include four rows of structural units that are each constituted by nanowires 141 and pads 142 alternately lining up in the X direction (corresponding to the first direction) and are placed side by side in the Y direction (corresponding to the second direction). Gates 143 extending in the Y direction are provided above the nanowires 141. The reference numerals 112 and 114 denote pad structures including p-type pads. The pad structures 112 and 114 (second pad structures) each include six rows of structural units that are each constituted by nanowires 146 and pads 147 alternately lining up in the X direction and are placed side by side in the Y direction. Gates 148 extending in the Y direction are provided above the nanowires 146. The pad structure 112 is opposed to the pad structures 111 and 113 in the Y direction, and the pad structure 114 is opposed to the pad structures 113 and 115 in the Y direction.

In an interconnect layer M1 located above the pads 142 and 147, interconnects 81, 82, 83, 84, and 85 extending in the X direction (corresponding to the third direction) are formed. The interconnect 81 is formed above the pad structure 111 and connected with the pads 142 of the pad structure 111. Similarly, the interconnects 82, 83, 84, and 85 are respectively formed above the pad structures 112, 113, 114, and 115 and connected with the pads 142 and 147 of the pad structures 112, 113, 114, and 115. The interconnects in the interconnect layer M1 and the pads of the pad structures are connected together via contacts and local interconnects not shown.

In an interconnect layer M2 located above the interconnect layer M1, four interconnects 61, 62, 63, and 64 (second power interconnects) constituting the above-described power interconnect 6 are formed to extend in the Y direction (corresponding to the fourth direction). The interconnects 61, 62, 63, and 64 are connected with the interconnects 81, 83, and 85 (first power interconnects) in the interconnect layer M1 via contacts 18. The direction in which the interconnects 81, 82, 83, 84, and 85 in the interconnect layer M1 extend is the same as the direction in which the pads 142 and 147 extend (X direction), and the direction in which the interconnects 61, 62, 63, and 64 in the interconnect layer M2 extend is the same as the direction in which the rows of pads 142 and 147 are placed side by side (Y direction).

In the pad structures 111, 113, and 115, assume that the gates 143 are connected with the interconnects 81, 83, and 85, as are the pads 142. Assume however that the gates 148 are floating, not connected with the interconnects 82 and 84.

The power supply voltage VDDIO is supplied to the pad structures 111, 113, and 115 from the interconnects 61, 62, 63, and 64 constituting the power interconnect 6 via the interconnects 81, 83, and 85. Input/output signals are supplied to the pad structures 112 and 114 from external pads (not shown) connected to the outside of the chip via the interconnects 82 and 84 (first signal interconnects).

A diode is formed between the pad structure 111 and the pad structure 112 opposed in the Y direction. Similarly, diodes are each formed between the opposed pad structures 112 and 113, between the opposed pad structures 113 and 114, and between the opposed pad structures 114 and 115. The ESD protection function is achieved by these diodes.

In the configuration of FIG. 11, the number of rows of pads 147 in the Y direction (six in the illustrated example) of each of the pad structures 112 and 114 to which input/output signals are supplied is greater than the number of rows of pads 142 in the Y direction (four in the illustrated example) of each of the pad structures 111, 113, and 115 to which power is supplied, and the width occupied by the pad structures 112 and 114 each in the Y direction is greater than the width occupied by the pad structures 111, 113, and 115 each. Also, the width of the interconnects 82 and 84 as the signal interconnects in the Y direction is greater than the width of the interconnects 81, 83, and 85 as the power interconnects. Having such a configuration, since a large current is allowed to flow swiftly to the diodes at the time of occurrence of an ESD event, damage to internal circuits can be effectively prevented or reduced.

Having the configuration of FIG. 11, the ESD portion 101 for VDDIO can be formed in a process similar to the process for nanowire FETs in other portions of the semiconductor integrated circuit device 1. Also, since variations in the roughness of the nanowires can be prevented or reduced, the precision of the finished dimensions of the nanowire shape can be improved.

Although the power supply voltage VDDIO is supplied to the gates 143 in the pad structures 111, 113, and 115 in the configuration of FIG. 11, the gates 143 may be made floating. Also, although the gates 148 are floating in the pad structures 112 and 114, the same input/output signals as those supplied to the pads 147 may be supplied to the gates 148. It is however more preferable for the gates 148 to be floating in the pad structures 112 and 114 because this state will not increase the load capacitance for the interconnects 82 and 84 as the signal interconnects. Note that another power supply, etc. may be connected to the gates 148 so as not to increase the load capacitance for the signal interconnects.

For the ESD portion 102 for VSS, although illustration is omitted here, the power supply voltage may be changed to VSS and the conductivity types (p/n) of the pad structures may be reversed from the configuration of FIG. 11, as in the case of the ESD portion 102 for VSS in FIG. 4 in the first embodiment.

(Alteration 1)

Figure 12:
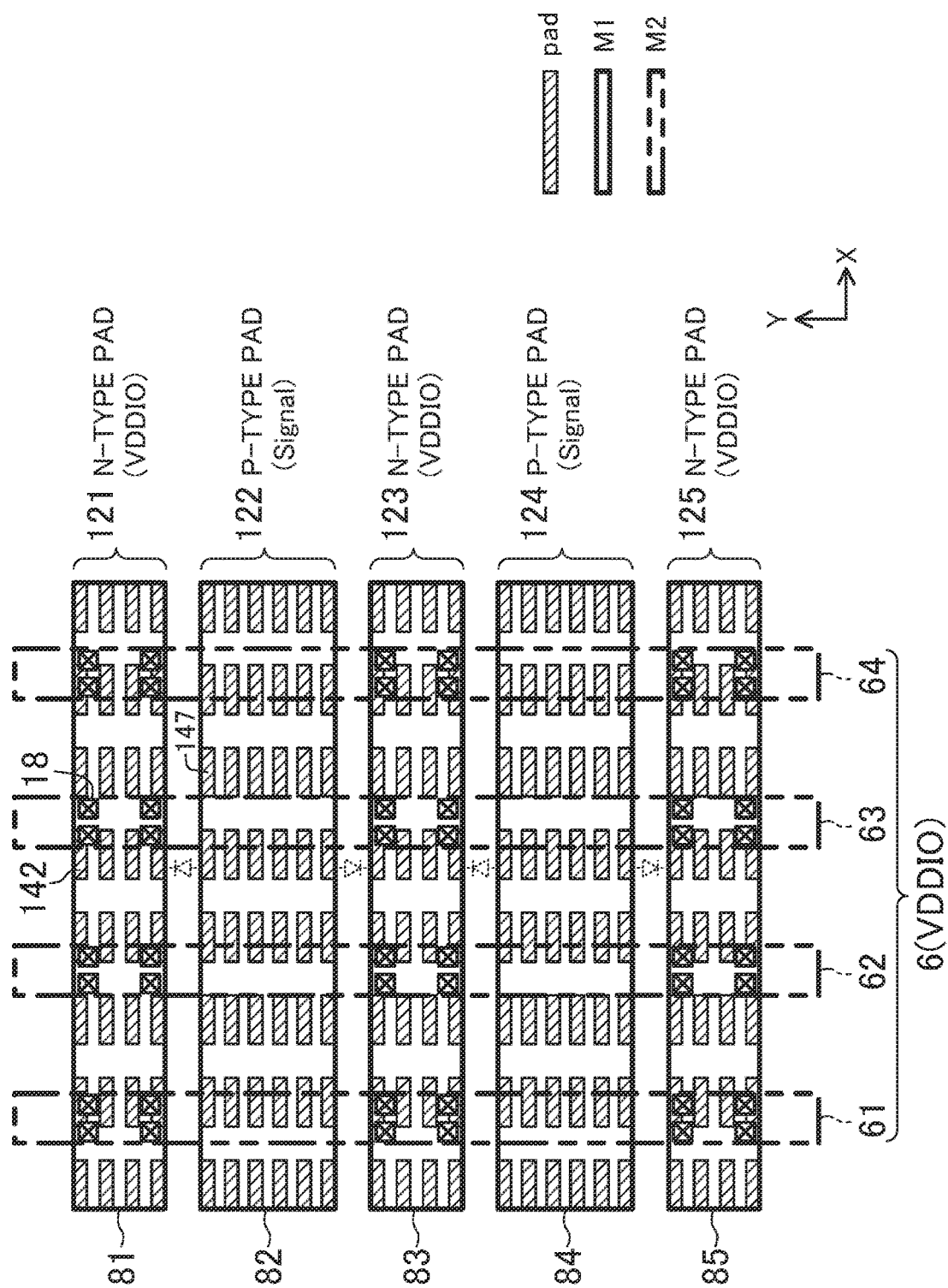
FIG. 12 is a view showing a configuration of an ESD portion for VDDIO according to Alteration 1 of the third embodiment.

FIG. 12 is a view showing a configuration of an ESD portion for VDDIO according to Alteration 1. The configuration of FIG. 12 is equivalent to a configuration in which the nanowires 141 and 146 and the gates 143 and 148 are omitted from the pad structures 111 to 115 in the configuration of FIG. 11. That is, in FIG. 12, the reference numerals 121, 123, and 125 denote pad structures (first pad structures) including n-type pads 142, and the reference numerals 122 and 124 denote pad structures (second pad structures) including p-type pads 147.

In the configuration of FIG. 12, also, a similar effect to that in the configuration of FIG. 11 can be obtained. That is, in the configuration of FIG. 12, the number of rows of pads 147 in the Y direction (six in the illustrated example) of each of the pad structures 122 and 124 to which input/output signals are supplied is greater than the number of rows of pads 142 in the Y direction (four in the illustrated example) of each of the pad structures 121, 123, and 125 to which power is supplied, and the width occupied by the pad structures 122 and 124 each in the Y direction is greater than the width occupied by the pad structures 121, 123, and 125 each. Also, the width of the interconnects 82 and 84 as the signal interconnects in the Y direction is greater than the width of the interconnects 81, 83, and 85 as the power interconnects. Having such a configuration, since a large current is allowed to flow swiftly to the diodes at the time of occurrence of an ESD event, damage to internal circuits can be effectively prevented or reduced.

(Other Alterations)

In the configuration of FIG. 11, the gates 143 and 148 may be omitted. Also, in the configuration of FIG. 12, each of the rows of pads 142 and 147 lining up in the X direction with spacing between adjacent pads may be changed to a single long pad extending in the X direction.

Alterations 1 and 3 shown in the first embodiment may be applied to this embodiment. That is, as in Alteration 1 of the first embodiment shown in FIG. 5, the number of rows of pads in the Y direction may be reduced in the pad structures 112, 114, 122, and 124. Also, as in Alteration 3 of the first embodiment shown in FIG. 9, pad structures including a plurality of n-type pads may be provided on at least one side of each of the pad structures 112, 114, 122, and 124 in the X direction.

The alterations described above may be applied in combination.

Fourth Embodiment

The entire configuration of a semiconductor integrated circuit device according to the fourth embodiment is as shown in FIG. 1. In this embodiment, as in the third embodiment, the semiconductor integrated circuit device 1 is assumed to have nanowire FETs. The configuration of an ESD protection circuit according to this embodiment will be described hereinafter taking, as examples, the ESD portion 103 for VDDIO and the ESD portion 104 for VSS in the IO cell 10B shown in FIG. 2B.

In the manufacturing process of nanowire FETs, it is generally necessary to make the direction of extension of nanowires uniform in the entire semiconductor chip. Therefore, in the IO cell 10B, nanowires are placed to extend in the X direction. For this reason, in this embodiment, the relationship between the direction in which the pads extend and the direction in which the interconnects extend is different from that in the third embodiment.

Figure 13:
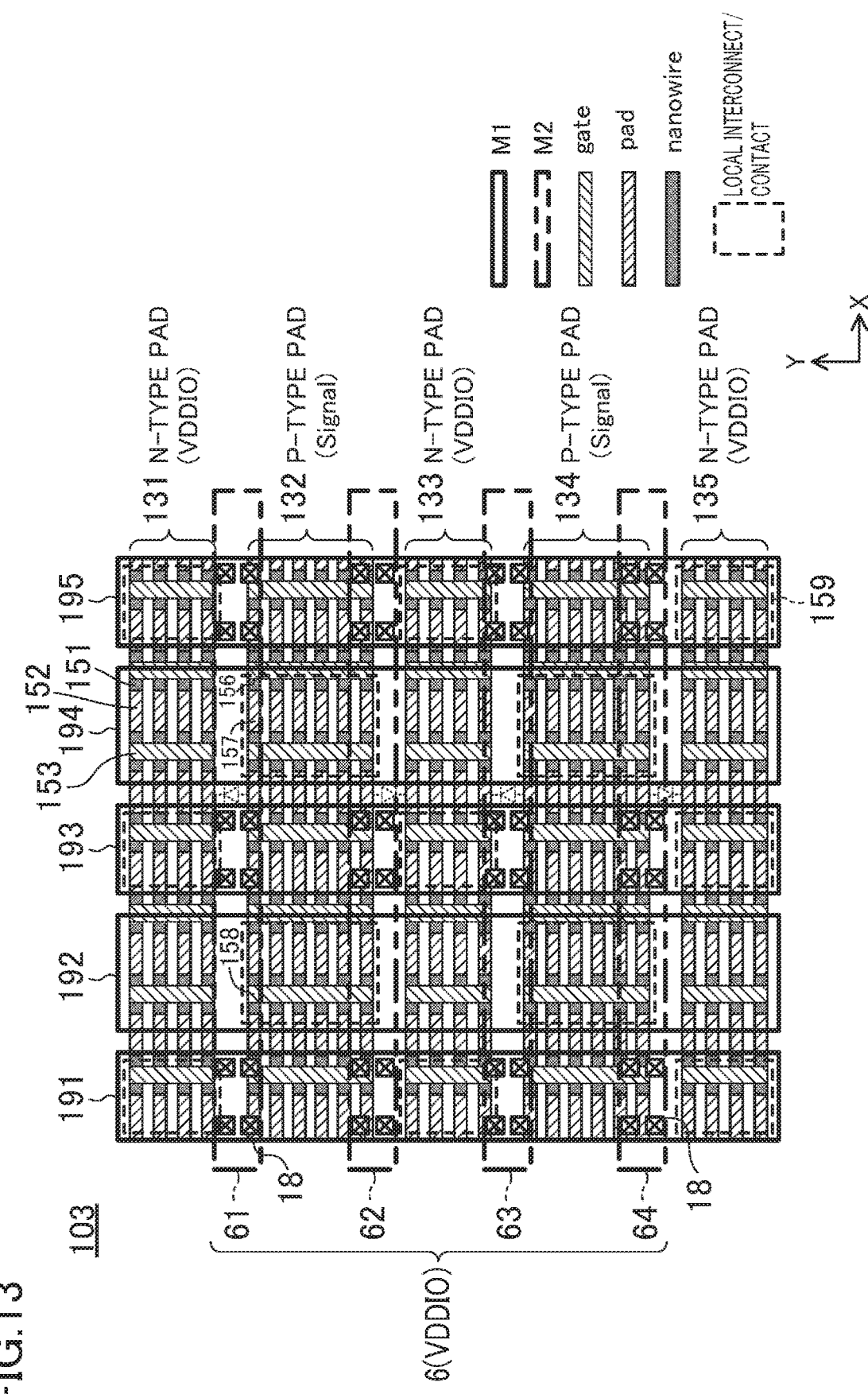
FIG. 13 is a view showing a configuration of an ESD portion for VDDIO according to the fourth embodiment.
Figure 14:
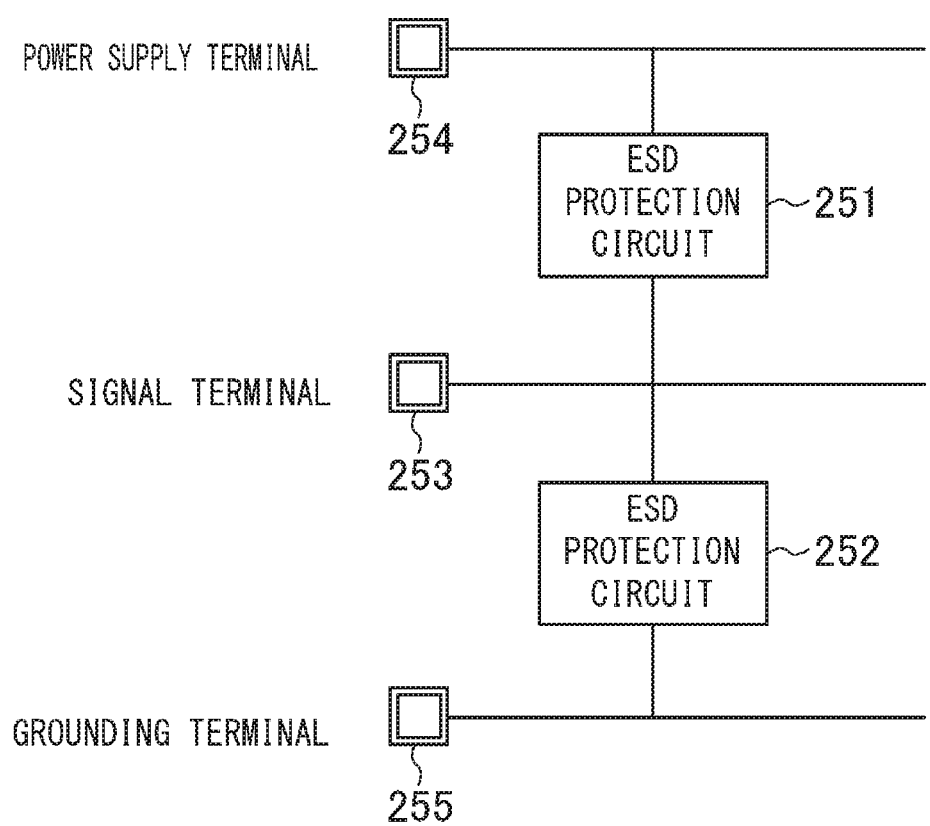
FIG. 14 is a circuit diagram showing the relationship between a signal terminal and ESD protection circuits.

FIG. 13 is a view showing the configuration of the ESD portion 103 for VDDIO according to this embodiment. In FIG. 13, the reference numerals 131, 133, and 135 denote pad structures including n-type nanowire FETs. The pad structures 131, 133, and 135 (first pad structures) each include four rows of structural units that are each constituted by nanowires 151 and pads 152 alternately lining up in the X direction (corresponding to the first direction) and are placed side by side in the Y direction (corresponding to the second direction). Gates 153 extending in the Y direction are provided above the nanowires 151. The reference numerals 132 and 134 denote pad structures including p-type nanowire FETs. The pad structures 132 and 134 (second pad structures) each include six rows of structural units that are each constituted by nanowires 156 and pads 157 alternately lining up in the X direction and are placed side by side in the Y direction. Gates 158 extending in the Y direction are provided above the nanowires 156. The pad structure 132 is opposed to the pad structures 131 and 133 in the Y direction, and the pad structure 134 is opposed to the pad structures 133 and 135 in the Y direction.

In an interconnect layer M1 located above the pads 152 and 157, interconnects 191, 192, 193, 194, and 195 extending in the Y direction (corresponding to the third direction) are formed. The interconnects 191, 193, and 195 (first power interconnects) are connected with the pads 152 of the pad structures 131, 133, and 135. The interconnects 192 and 194 (first signal interconnects) are connected with the pads 157 of the pad structures 132 and 134. The interconnects in the interconnect layer M1 and the pads of the pad structures are connected together via connections 159 constituted by contacts and local interconnects. Although the connections 159 are shown as dashed rectangles in FIG. 13 to diagrammatically illustrate the presence of the connections 159, the connections 159 can have an arbitrary shape.

In an interconnect layer M2 located above the interconnect layer M1, four interconnects 61, 62, 63, and 64 (second power interconnects) constituting the above-described power interconnect 6 are formed to extend in the X direction (corresponding to the fourth direction). The interconnects 61, 62, 63, and 64 are connected with the interconnects 191, 193, and 195 in the interconnect layer M1 via contacts 18. The direction in which the interconnects 191, 192, 193, 194, and 195 in the interconnect layer M1 extend is the same as the direction in which the rows of pads 152 and 157 are placed side by side (Y direction), and the direction in which the interconnects 61, 62, 63, and 64 in the interconnect layer M2 extend is the same as the direction in which the pads 152 and 157 extend (X direction).

The power supply voltage VDDIO is supplied to the pad structures 131, 133, and 135 from the interconnects 61, 62, 63, and 64 constituting the power interconnect 6 via the interconnects 191, 193, and 195. Input/output signals are supplied to the pad structures 132 and 134 from external pads (not shown) connected to the outside of the chip via the interconnects 192 and 194.

A diode is formed between the pad structure 131 and the pad structure 132 opposed in the Y direction. Similarly, diodes are each formed between the opposed pad structures 132 and 133, between the opposed pad structures 133 and 134, and between the opposed pad structures 134 and 135. The ESD protection function is achieved by these diodes.

In the configuration of FIG. 13, the number of rows of pads 157 in the Y direction (six in the illustrated example) of each of the pad structures 132 and 134 to which input/output signals are supplied is greater than the number of rows of pads 152 in the Y direction (four in the illustrated example) of each of the pad structures 131, 133, and 135 to which power is supplied, and the width occupied by the pad structures 132 and 134 each in the Y direction is greater than the width occupied by the pad structures 131, 133, and 135 each. Also, the width of the interconnects 192 and 194 as the signal interconnects in the X direction is greater than the width of the interconnects 191, 193, and 195 as the power S interconnects. Having such a configuration, since a large current is allowed to flow swiftly to the diodes at the time of occurrence of an ESD event, damage to internal circuits can be effectively prevented or reduced.

Also, since the direction in which nanowires and pads extend is made uniform over the right- and left-side IO cells (e.g., the IO cell 10A) and the upper- and lower-side IO cells (e.g., the IO cell 10B), the number of man-hours for design can be reduced.

The alterations described in the third embodiment can also be applied to the configuration of the ESD portion 103 for VDDIO in FIG. 13. That is, in the pad structures 131 to 135, the gates 153 and 158 may be omitted. Otherwise, in the pad structures 131 to 135, the nanowires 151 and 156 and the gates 153 and 158 may be omitted. Otherwise, in the pad structures 131 to 135, the nanowires 151 and 156 and the gates 153 and 158 may be omitted, and each of the rows of pads 152 and 157 lining up in the X direction with spacing between adjacent pads may be changed to a single long pad extending in the X direction.

Alterations 1 and 3 described in the first embodiment may be applied to this embodiment. That is, as in Alteration 1 of the first embodiment shown in FIG. 5, the number of rows of pads in the Y direction may be reduced in the pad structures 132 and 134. Also, as in Alteration 3 of the first embodiment shown in FIG. 9, pad structures including a plurality of n-type pads may be provided on at least one side of each of the pad structures 132 and 134 in the X direction.

Although illustration is omitted here for the ESD portion 104 for VSS, the power supply voltage may be changed to VSS and the conductivity types (p/n) of the pad structures may be reversed from the configuration of FIG. 13, as in the case of the ESD portion 102 for VSS in FIG. 4 in the first embodiment. Also, the alterations described in the third embodiment and Alternations 1 and 3 described in the first embodiment may also be applied to the configuration of the ESD portion 104 for VSS.

Further, the alterations described above may be applied in combination.

The number of fins included in each fin structure and the number of pads included in each pad structure are not limited to those described in the above embodiments. The interconnect layer in which the signal interconnects are formed is not limited to the interconnect layer M1, but the signal interconnects may be formed in a plurality of interconnect layers. Also, the interconnect layer in which the ring power interconnects are formed is not limited to the interconnect layer M2, but may be any interconnect layer located above the interconnect layer in which the signal interconnects are formed. The ring power interconnects may be formed in a plurality of interconnect layers. This will decrease the resistance values of the ring power interconnects, thereby improving the ESD tolerance.

What is claimed is:

1. A semiconductor integrated circuit device provided with fin field effect transistors (FETs) comprising:
   an electrostatic discharge (ESD) protection circuit,
   wherein
   the ESD protection circuit includes
      a first fin structure having a plurality of fins of a first conductivity type that extend in a first direction and are placed side by side in a second direction perpendicular to the first direction,
      a second fin structure having a plurality of fins of a second conductivity type that extend in the first direction and are placed side by side in the second direction, the second fin structure being opposed to the first fin structure in the second direction,
      a first power interconnect for power supply that is formed in a first interconnect layer located above the first and second fin structures, extends in a third direction, and is connected with the first fin structure,
      a first signal interconnect for signal transfer that is formed in the first interconnect layer, extends in the third direction, and is connected with the second fin structure, and
      a second power interconnect for power supply that is formed in a second interconnect layer located above the first interconnect layer, extends in a fourth direction perpendicular to the third direction, and is connected with the first power interconnect,
   a width occupied by the second fin structure in the second direction is greater than a width occupied by the first fin structure in the second direction, and
   a width of the first signal interconnect in the fourth direction is greater than a width of the first power interconnect in the fourth direction.

2. The semiconductor integrated circuit device of claim 1, wherein
   the third direction is identical to the first direction, and the fourth direction is identical to the second direction.

3. The semiconductor integrated circuit device of claim 1, wherein
   the third direction is identical to the second direction, and the fourth direction is identical to the first direction.

4. The semiconductor integrated circuit device of claim 1, wherein
   a number of fins of the second fin structure is greater than a number of fins of the first fin structure.

5. The semiconductor integrated circuit device of claim 1, wherein
the first and second fin structures each include a gate formed above the fins to extend in the second direction.

6. The semiconductor integrated circuit device of claim 5, wherein
in the second fin structure, the gate is floating.

7. The semiconductor integrated circuit device of claim 1, wherein
the ESD protection circuit includes
a third fin structure placed on at least one side of the second fin structure in the first direction, the third fin structure including a plurality of fins of the first conductivity type that extend in the first direction and are placed side by side in the second direction, and
the third fin structure is supplied with power via the first and second power interconnects.

8. A semiconductor integrated circuit device provided with nanowire field effect transistors (FETs) comprising:
an electrostatic discharge (ESD) protection circuit, wherein
the ESD protection circuit includes
a first pad structure having a plurality of rows of pads of a first conductivity type that extend in a first direction and are placed side by side in a second direction perpendicular to the first direction,
a second pad structure having a plurality of rows of pads of a second conductivity type that extend in the first direction and are placed side by side in the second direction, the second pad structure being opposed to the first pad structure in the second direction,
a first power interconnect for power supply that is formed in a first interconnect layer located above the first and second pad structures, extends in a third direction, and is connected with the first pad structure,
a first signal interconnect for signal transfer that is formed in the first interconnect layer, extends in the third direction, and is connected with the second pad structure, and
a second power interconnect for power supply that is formed in a second interconnect layer located above the first interconnect layer, extends in a fourth direction perpendicular to the third direction, and is connected with the first power interconnect,
a width occupied by the second pad structure in the second direction is greater than a width occupied by the first pad structure in the second direction, and
a width of the first signal interconnect in the fourth direction is greater than a width of the first power interconnect in the fourth direction.

9. The semiconductor integrated circuit device of claim 8, wherein
the third direction is identical to the first direction, and the fourth direction is identical to the second direction.

10. The semiconductor integrated circuit device of claim 9, wherein
the first and second pad structures each include a structural unit having the pads and nanowires alternately lining up in the first direction and a gate formed to surround the nanowires and extend in the second direction.

11. The semiconductor integrated circuit device of claim 10, wherein
in the second pad structure, the gate is floating.

12. The semiconductor integrated circuit device of claim 8, wherein
the third direction is identical to the second direction, and the fourth direction is identical to the first direction.

13. The semiconductor integrated circuit device of claim 8, wherein
a number of rows of pads of the second pad structure in the second direction is greater than a number of rows of pads of the first pad structure in the second direction.

14. A semiconductor integrated circuit device provided with fin field effect transistors (FETs) comprising:
an electrostatic discharge (ESD) protection circuit, wherein
the ESD protection circuit includes
a first fin structure having a plurality of fins of a first conductivity type that extend in a first direction and are placed side by side in a second direction perpendicular to the first direction and a gate formed above the fins to extend in the second direction,
a second fin structure having a plurality of fins of a second conductivity type that extend in the first direction and are placed side by side in the second direction and a gate formed above the fins to extend in the second direction, the second fin structure being opposed to the first fin structure in the second direction,
a first power interconnect for power supply that is formed in a first interconnect layer located above the first and second fin structures, extends in a third direction, and is connected with the first fin structure,
a first signal interconnect for signal transfer that is formed in the first interconnect layer, extends in the third direction, and is connected with the second fin structure, and
a second power interconnect for power supply that is formed in a second interconnect layer located above the first interconnect layer, extends in a fourth direction perpendicular to the third direction, and is connected with the first power interconnect, and
in the second fin structure, the gate is floating.

* * * * *